(12) United States Patent
Kim et al.

(10) Patent No.: US 12,198,783 B2
(45) Date of Patent: Jan. 14, 2025

(54) APPARATUS, MEMORY DEVICE, AND METHOD FOR MULTI-PHASE CLOCK TRAINING

(71) Applicant: SAMSUNG ELECTRONICS CO., LTD., Suwon-si (KR)

(72) Inventors: Taegook Kim, Seoul (KR); Woojin Na, Hwaseong-si (KR); Taegeun Yoo, Suwon-si (KR); Hyeseung Yu, Hwaseong-si (KR); Jaejun Lee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 196 days.

(21) Appl. No.: 17/959,663

(22) Filed: Oct. 4, 2022

(65) Prior Publication Data

US 2023/0147016 A1 May 11, 2023

(30) Foreign Application Priority Data

Nov. 9, 2021 (KR) .................. 10-2021-0153447
Mar. 18, 2022 (KR) .................. 10-2022-0034173

(51) Int. Cl.
*G11C 7/22* (2006.01)
*G11C 7/10* (2006.01)

(52) U.S. Cl.
CPC ............ *G11C 7/222* (2013.01); *G11C 7/1072* (2013.01); *G11C 7/109* (2013.01)

(58) Field of Classification Search
CPC ....... G11C 7/222; G11C 7/1072; G11C 7/109; G11C 2207/22; G11C 2207/2254;
(Continued)

(56) References Cited

U.S. PATENT DOCUMENTS 7,321,524 B2    1/2008  Shaeffer et al.
7,840,831 B2 *  11/2010 Jang ...................... H03K 5/135
                                                    327/354
(Continued)

FOREIGN PATENT DOCUMENTS

KR    10-0866132 B1    10/2008
KR    10-1242302 B1     3/2013
(Continued)

OTHER PUBLICATIONS

European Search Report dated Feb. 6, 2023.
Taiwanese Office Action dated Aug. 9, 2023, of the corresponding TW Patent Application No. 111142716.

*Primary Examiner* — Michael T Tran
(74) *Attorney, Agent, or Firm* — Muir Patent Law, PLLC

(57) ABSTRACT

Provided are an apparatus, a memory device, and a method for multi-phase clock training. The memory device includes a clock training circuit configured to receive a clock through a first signal pin, among a plurality of signal pins and connected to a first signal line connected to the first signal pin. The clock training circuit generates a multi-phase clock upon receiving the clock, and generates a three-dimensional (3-D) duty offset code (DOC) for the multi-phase clock by simultaneously phase-sweeping between three internal clock signals in a duty adjustment step in the multi-phase clock. The memory device corrects a duty error of the multi-phase clock using the 3-D DOC.

19 Claims, 16 Drawing Sheets

(58) Field of Classification Search
CPC . G11C 2207/2272; G11C 7/22; G11C 7/1069;
G11C 7/1096; G06F 13/1689
USPC .......................................... 365/233.1, 233.5
See application file for complete search history.

(56) References Cited

U.S. PATENT DOCUMENTS

| | | |
|---|---|---|
| 7,872,924 B2 | 1/2011 | Ma |
| 8,228,105 B2 | 7/2012 | McLeod et al. |
| 8,400,196 B2 | 3/2013 | Kim |
| 9,018,990 B2 | 4/2015 | Liu |
| 9,218,860 B2 | 12/2015 | Gay |
| 9,660,631 B2 | 5/2017 | Seo et al. |
| 10,628,254 B2 | 4/2020 | Lee |
| 10,698,846 B2 | 6/2020 | Chi et al. |
| 11,005,468 B1 | 5/2021 | Subramanian et al. |
| 11,092,994 B1* | 8/2021 | Hong .................. G06F 1/06 |
| 2007/0064462 A1 | 3/2007 | Matsui |
| 2007/0121775 A1 | 5/2007 | Chen et al. |
| 2013/0034134 A1 | 2/2013 | Chiu |
| 2018/0156870 A1* | 6/2018 | Kim .................. G01R 31/286 |
| 2019/0081619 A1 | 3/2019 | Kim et al. |
| 2021/0200256 A1* | 7/2021 | Shi .................... G06F 1/12 |
| 2021/0358534 A1* | 11/2021 | Choi .................. H03L 7/0816 |
| 2022/0059155 A1* | 2/2022 | Choi .................. G11C 29/46 |
| 2022/0239300 A1* | 7/2022 | Yao .................... G11C 7/222 |
| 2022/0319563 A1* | 10/2022 | Kim .................... G11C 8/18 |

FOREIGN PATENT DOCUMENTS

| | | |
|---|---|---|
| TW | 200720932 A | 6/2007 |
| TW | I722582 B | 3/2021 |

\* cited by examiner

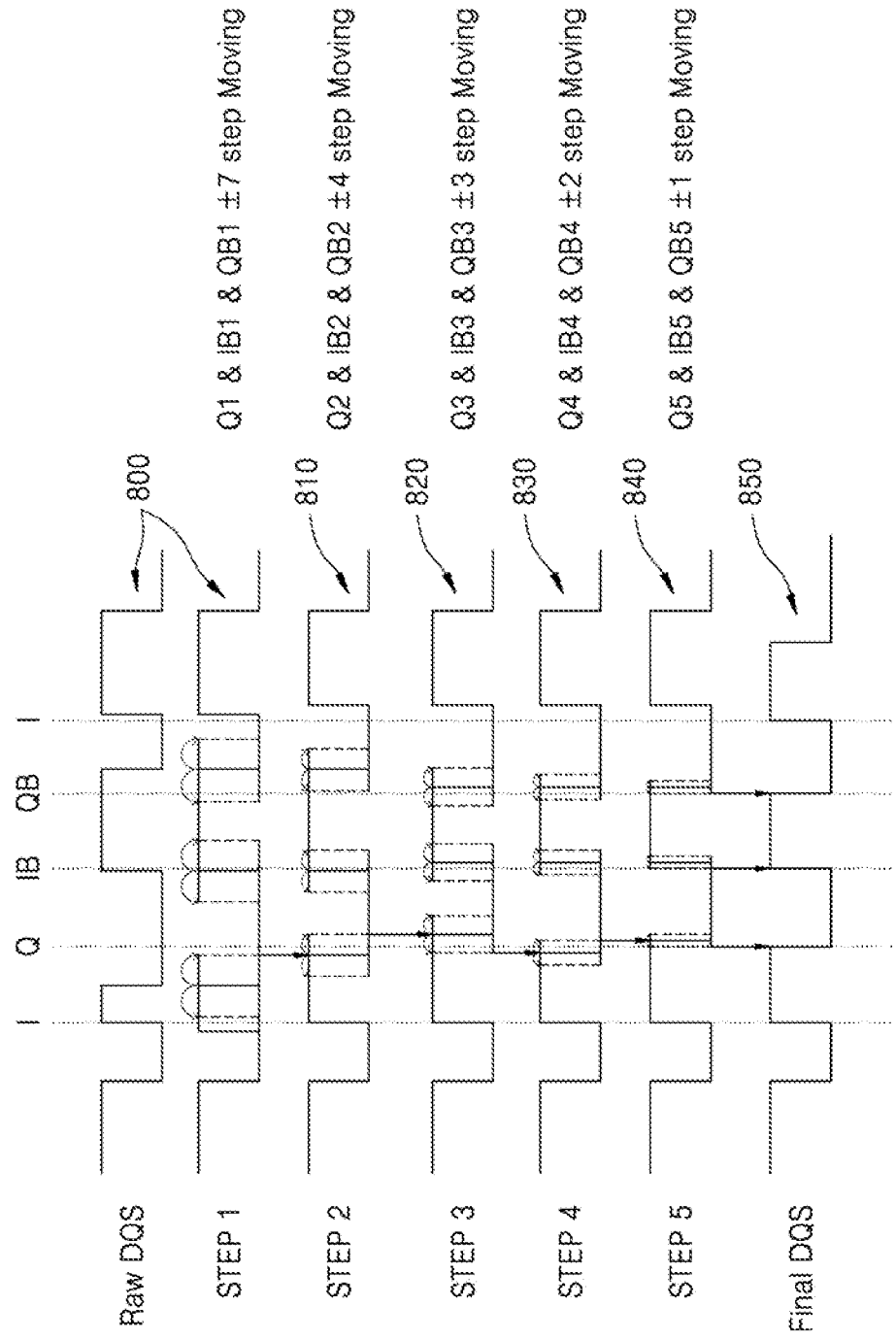

FIG. 9

| STEP | Total Case | Skip Case | Evaluation Case | Number of Evaluation | Duty Adjustment Point |
|------|------------|-----------|-----------------|----------------------|-----------------------|
| 1 | QCLK={-7,0,7} IBCLK={-7,0,7} QBCLK={-7,0,7} | | (0,0,0),(0,0,7),(0,0,-7), (0,7,0),(0,7,7),(0,7,-7), (0,-7,0),(0,-7,7),(0,-7,-7), (7,0,0),(7,0,7),(7,0,-7), (7,7,0),(7,7,7),(7,7,-7), (7,-7,0),(7,-7,7),(7,-7,-7), (-7,0,0),(-7,0,7),(-7,0,-7), (-7,7,0),(-7,7,7),(-7,7,-7), (-7,-7,0),(-7,-7,7),(-7,-7,-7) | 27 | {Q1,IB1,QB1} =(-7,0,0) |
| 2 | All 27 combinations of {Q1}&QCLK={-4,0,4} {IB1}&IBCLK={-4,0,4} {QB1}&QBCLK={-4,0,4} | (-7,0,4),(-7,-4,4),(-7,4,4), (-7,4,0),(-7,4,-4),(-11,0,0), (-11,0,-4),(-11,0,4), (-11,-4,0),(-11,-4,4), (-11,-4,-4),(-11,4,0), (-11,4,4),(-11,4,-4) | (-7,0,-4),(-7,-4,0),(-7,0,0), (-7,-4,-4),(-3,0,0),(-3,0,-4), (-3,0,4),(-3,-4,0),(-3,-4,4), (-3,-4,-4),(-3,4,0),(-3,4,4), (-3,4,-4) | 13 | {Q2,IB2,QB2} =(-3,0,4) |
| 3 | All 27 combinations of {Q2}&QCLK={-3,0,3} {IB2}&IBCLK={-3,0,3} {QB2}&QBCLK={-3,0,3} | (-3,0,7),(-3,3,7),(-3,-3,7), (0,-3,7),(-6,0,4),(-6,0,7), (-6,3,4),(-6,3,7),(-6,3,1), (-6,3,4),(-6,-3,7) | (-3,0,4),(-3,0,1),(-3,3,1), (-3,3,4),(-3,-3,4),(-3,-3,1), (0,0,4),(0,0,7),(0,0,1), (0,3,4),(0,3,7),(0,3,1), (0,3,4),(0,-3,1),(-6,0,1), (-6,-3,1) | 16 | {Q3,IB3,QB3} =(-3,3,1) |
| 4 | All 27 combinations of {Q3}&QCLK={-2,0,2} {IB3}&IBCLK={-2,0,2} {QB3}&QBCLK={-2,0,2} | (-3,5,1),(-3,5,3),(-3,5,-1), (-5,3,1),(-5,3,3),(-5,3,-1), (-5,5,1),(-5,5,3),(-5,5,-1) | (-3,3,1),(-3,3,3),(-3,3,-1), (-3,1,1),(-3,1,3),(-3,1,-1), (-1,3,1),(-1,3,3),(-1,3,-1), (-1,5,1),(-1,5,3),(-1,5,-1), (-1,1,1),(-1,1,3),(-1,1,-1), (-5,1,1),(-5,1,3),(-5,1,-1) | 18 | {Q4,IB4,QB4} =(-5,1,3) |
| 5 | All 27 combinations of {Q4}&QCLK={-1,0,1} {IB4}&IBCLK={-1,0,1} {QB4}&QBCLK={-1,0,1} | (-5,1,3),(-5,1,4),(-5,2,3), (-5,2,4),(-5,0,3),(-5,0,4), (-4,1,4),(-4,2,4),(-4,0,4), (-6,1,3),(-6,1,4),(-6,1,2), (-6,2,3),(-6,2,4),(-6,2,2), (-6,0,3),(-6,0,4),(-6,0,2) | (-5,1,2),(-5,2,2),(-5,0,2), (-4,1,3),(-4,1,2),(-4,2,3), (-4,2,2),(-4,0,3),(-4,0,2) | 9 | {Q5,IB5,QB5} =(-4,2,2) 3-D DOC |

APPARATUS, MEMORY DEVICE, AND METHOD FOR MULTI-PHASE CLOCK TRAINING

CROSS-REFERENCE TO RELATED APPLICATIONS

This application is based on and claims priority under 35 U.S.C. § 119 to Korean Patent Application Nos. 10-2021-0153447, filed on Nov. 9, 2021, and 10-2022-0034173, filed on Mar. 18, 2022, in the Korean Intellectual Property Office, the disclosures of which are incorporated by reference herein in their entireties.

BACKGROUND

1. Field

Embodiments relate to applications and methods, and more particularly, to an apparatus, a memory device, and an operating method for multi-phase clock training.

2. Description of the Related Art

In line with growing demand for increasing the speed of electronic systems, increasing data capacity, and consuming less power, semiconductor memories that may be accessed faster, store more data and use less power have been constantly developed.

SUMMARY

An embodiment is directed to a memory device including a plurality of signal pins and a clock training circuit configured to receive a clock through a first signal pin, among the plurality of signal pins, and connected to a first signal line connected to the first signal pin, wherein the clock training circuit generates a multi-phase clock upon receiving the clock, and generates a three-dimensional duty offset code (3-D DOC) for the multi-phase clock by simultaneously phase-sweeping between three internal clock signals in a duty adjustment step in the multi-phase clock.

An embodiment is directed to a memory controller including a plurality of signal pins; and a training circuit configured to transmit a clock through a first signal pin, among the plurality of signal pins, receive a three-dimensional duty offset code (3-D DOC) related to the clock through a second signal pin, and connected to a first signal line connected to the first signal pin and a second signal line connected to the second signal pin, wherein the training circuit adjusts a timing of the clock based on the 3-D DOC and outputs the adjusted timing to the first signal pin, the 3-D DOC is obtained by simultaneously phase-sweeping three internal clock signals in a multi-phase clock derived from the clock in a duty adjustment step by a clock training operation performed in a memory device connected to the first and second signal pins, and is configured to correct a duty error of the multi-phase clock.

An embodiment is directed to a method including receiving a clock from the outside, generating a multi-phase clock derived from the clock, performing a three-dimensional (3-D) duty offset search operation of simultaneously phase-sweeping between three internal clock signals in the multi-phase clock in a duty adjustment step, and generating a three-dimensional duty offset code (3-D DOC) for the multi-phase clock based on a result of the 3-D duty offset search operation.

BRIEF DESCRIPTION OF THE DRAWINGS

Features will become apparent to those of skill in the art by describing in detail example embodiments with reference to the attached drawings in which:

FIGS. 8 and 9 are diagrams illustrating an operation of a clock training circuit according to an example embodiment;

DETAILED DESCRIPTION

Figure 1:
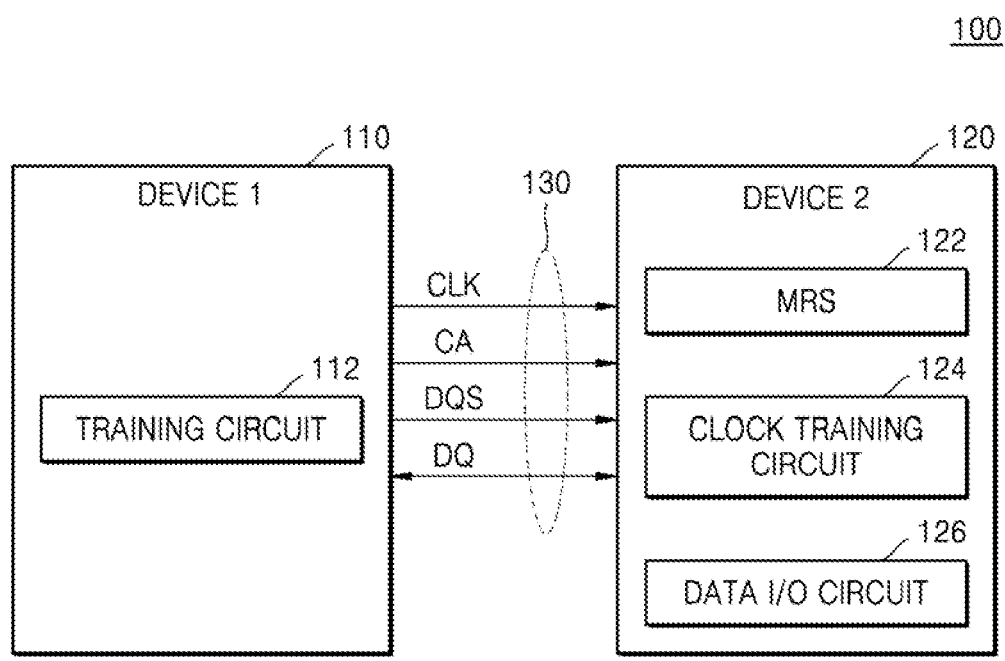
FIG. 1 is a block diagram of an apparatus according to an example embodiment.

FIG. 1 is a block diagram of an apparatus 100 according to an example embodiment.

Referring to FIG. 1, an apparatus 100 may include a first device (or device 1) 110 and a second device (or device 2) 120. The apparatus 100 may be implemented to be included in, e.g., a personal computer (PC) or a mobile electronic device. Mobile electronic devices may be implemented as, e.g., laptop computers, mobile phones, smartphones, tablet PCs, personal digital assistants (PDAs), enterprise digital assistants (EDAs), digital still cameras, digital video cameras, portable multimedia players (PMPs), personal navigation devices or portable navigation devices (PNDs), handheld game consoles, mobile Internet devices (MIDs), wearable computers, Internet of things (IoT) devices, Internet of everything (IoE) devices, or drones.

The first device 110 may be implemented as, e.g., an integrated circuit (IC), a system on a chip (SoC), an application processor (AP), a mobile AP, a chipset, or a set of chips. As an example, the first device 110 may be a semiconductor device that performs a memory control function, and the first device 110 may be a component included in an AP. The AP may include, e.g., a memory controller, a random-access memory (RAM), a central processing unit (CPU), a graphics processing unit (GPU), and/or a modem.

The second device 120 may be implemented as a memory device. The memory device may be implemented as, e.g., dynamic RAM (DRAM) or static RAM (SRAM). As an example, the second device 120 may correspond to double data rate synchronous dynamic random access memory (DDR SDRAM), low power double data rate (LPDDR) SDRAM, graphics double data rate (GDDR) SDRAM, Rambus dynamic random access memory (RDRAM), and so on. In another implementation, the second device 120 may be implemented as high bandwidth memory (HBM).

According to an example embodiment, the second device 120 may be implemented as a nonvolatile memory device. As an example, the second device 120 may be implemented as flash memory or resistive memory, such as phase change RAM (PRAM), magnetic RAM (MRAM), or resistive RAM (RRAM).

The second device may be a memory device that includes a plurality of signal pins, e.g., a first signal pin to receive a clock signal and a second signal pin to output a three-dimensional duty offset code. The second signal pin may be a data pin or a data clock pin.

Hereinafter, for convenience of description, the first device 110 is referred to as a memory controller, and the second device 120 is referred to as a memory device.

Although the memory device 120 is illustrated as a single semiconductor chip, the memory device 120 may include n (n is a non-zero whole number) memory devices in actuality.

The memory controller 110 and the memory device 120 may communicate with each other through a bus (e.g., a data bus (or data (DQ) bus), a clock bus, a command/address (CA) bus, etc.) 130. In an example, a command and address CA are received by the memory device 120 through a command/address bus 130, and data DQ is provided between the memory controller 110 and the memory device 120 via the data bus 130. Various clock signals may be provided between the memory controller 110 and the memory device 120 via the clock bus 130. The clock bus 130 may include signal lines for providing system clocks CLK_t and CLK_c received by the memory device 120 and data clocks DQS_t and DQS_c transmitted and received by the memory device 120. Each bus 130 may include one or more signal lines to which signals are provided.

In an example embodiment, the clocks CLK_t and CLK_c provided by the memory controller 110 to the memory device 120 are used for a timing of provision and reception of commands and addresses. The clocks DQS_t and DQS_c are used for a timing of data provision. The clocks CLK_t and CLK_c are complementary, and the clocks DQS_t and DQS_c are complementary. The clock signal is complementary when a rising edge of a first clock signal coincides with a falling edge of a second clock signal and when a rising edge of the second clock signal coincides with a falling edge of the first clock signal. According to an example embodiment, the memory controller 110 and the memory device 120 may use the data clock DQS by classifying the data clock DQS as a write data clock and a read data clock.

The clocks DQS_t and DQS_c provided to the memory device 120 by the memory controller 110 may be synchronized with the clocks CLK_t and CLK_c provided to the memory device 120 by the memory controller 110. Also, the clocks DQS_t and DQS_c may have higher clock frequencies than the clocks CLK_t and CLK_c. For example, the clocks DQS_t and DQS_c may have a clock frequency that is twice the clock frequency of the clocks CLK_t and CLK_c. Hereinafter, for convenience of description, the clocks CLK_t and CLK_c may be referred to as CLK clocks, and clocks DQS_t and DQS_c may be referred to as DQS clocks.

The memory controller 110 may provide a command to the memory device 120 to perform a memory operation. Examples of a memory command may include a timing command for controlling a timing of various operations, an access command for accessing a memory, e.g., a read command for performing a read operation and a write command for performing a write operation, a mode register write and read command for performing a mode register write and read operation, and the like.

During an operation, when a read command and a related address are provided to the memory device 120 by the memory controller 110, the memory device 120 may receive a read command and a related address and perform a read operation to output read data DQ from a memory location corresponding to the related address. The read data DQ may be provided to the memory controller 10 by the memory device 120, according to a timing related to reception of the read command. For example, when the read data DQ is provided to the memory controller 110 by the memory device 120, a timing may be based on a read latency RL value indicating the number (referred to as tCLK) of clock cycles of CLK clocks after the read command. In an example embodiment, the read latency RL value is programmed by the memory controller 110 in the memory device 120. For example, the read latency RL value may be programmed into each mode register of the memory device 120. The mode register included in each memory device 120 may be programmed with information for setting various operation modes and/or for selecting characteristics for a memory operation. One of the settings may be for the read latency RL value.

When the memory device 120 that provides the read data DQ to the memory controller 110 is preparing, the memory controller 110 may provide an active CLK clock to the memory device 120. The CLK clock may be used by the memory device 120 to generate a DQS clock. In an example embodiment, a clock signal is activated when the clock signal periodically transitions between a low clock level and a high clock level; conversely, the clock signal is deactivated when the clock signal maintains a constant clock level and does not transition periodically. The DQS clock may be provided to the memory controller 110 by the memory device 120 that has performed a read operation for a timing to provide read data to the memory controller 110. The memory controller 110 may use the DQS clock to receive the read data DQ.

During an operation, when a write command and a related address are provided to the memory device 120 by the memory controller 110, the memory device 120 may receive the write command and the related address, and perform a write operation to write the write data DQ from the memory controller 110 to a memory location corresponding to the related address. In an example embodiment, the write data DQ is provided to the memory device 120 by the memory controller 110 according to a timing related to reception of the write command. For example, when the write data DQ is provided to the memory device 120 by the memory controller 110, a timing may be based on a write latency WL value indicating the number of clock cycles tCLK of CLK clocks after the write command DQ. The write latency WL value may be programmed by the memory controller 110 in the memory device 120. For example, the write latency WL value may be programmed into a mode register of the memory device 120.

When the memory device 120 that receives the write data DQ from the memory controller 110 is preparing, the memory controller 110 may provide an active CLK clock to the memory device 120. The CLK clock may be used by the memory device 120 to generate an internal clock signal for an operation timing of a circuit receiving the write data DQ. The write data DQ may be provided by the memory controller 110. The memory device 120 may receive the write data DQ together with the DQS clock. The write data DQ may be written to a memory corresponding to the memory address.

In order to accurately perform a memory operation according to the operation timings, the memory controller 110 may include a training circuit 112 that performs memory training on the memory device 120. The training circuit 112 may perform memory core parameter training associated with a memory core and/or peripheral circuit parameter training for peripheral circuits other than the memory core in the memory device 120, in response to a training command. The training circuit 112 may be a training subject to determine an optimal parameter for the memory core parameter and/or a peripheral circuit parameter.

In the present example embodiment, it is described that the training circuit 112 is included in the memory controller 110, but the training circuit 112 may be included in the memory device 120 and the memory device 120 may be a subject to perform memory training.

The training circuit 112 may perform a clock training operation on the CLK clock and the DQS clock in connection with peripheral circuit parameter training. The training circuit 112 may perform a clock training operation in association with a clock training circuit 124 of the memory device 120. This will be described in detail with reference to FIGS. 3 to 10.

The memory device 120 may include a mode register (MRS) 122, the clock training circuit 124, and a data input/output (I/O) circuit 126.

The MRS 122 may store information used to configure an operation of the memory device 120 to set an operating condition for the memory device 120. The MRS 122 may store information for timing adjustment of a multi-phase clock associated with the CLK clock.

The information for timing adjustment of a multi-phase clock may include a three-dimensional duty offset code (3-D DOC) (FIG. 2) for providing a 50% duty cycle-adjusted DQS clock. The 3-D DOC may be provided by the training circuit 112 of the memory controller 110 together with the memory core parameters and/or peripheral circuit parameters and stored in the MRS 122. According to an example embodiment, the 3-D DOC may be stored by the clock training circuit 124 in the MRS 122 as a result of a 3-D duty offset search operation for a multi-phase clock.

The clock training circuit 124 may generate a multi-phase clock upon receiving the CLK clock, and simultaneously phase-sweep three internal clock signals in the multi-phase clock by a duty adjustment step to generate the 3-D DOC for the multi-phase clock.

The clock training circuit 124 may perform a first step operation of sweeping the phases between the internal clock signals in a first adjustment range of −n to +n steps, select a first phase offset point among phase offset points associated with the first step operation, and output an internal clock signal including the first phase offset point, as a first internal clock signal.

The clock training circuit 124 may perform a second step operation of sweeping the phases between the first internal clock signals in a second adjustment range of −n/2 to +n/2 steps based on the first phase offset point as an origin, select a second phase offset point, among phase offset points associated with the second step operation, and output a first internal clock signal including the second phase offset point, as a second internal clock signal.

The clock training circuit 124 may perform a third step operation of sweeping the phases between the second internal clock signals in a third adjustment range of −n/4 to +n/4 steps with the second phase offset point as an origin, select a third phase offset point, among phase offset points associated with the third step operation, and output a second internal clock signal including the third phase offset point, as a third internal clock signal. The clock training circuit 124 may provide the third phase offset point as the 3-D DOC to the memory controller 110.

According to an example embodiment, the clock training circuit 124 may store the 3-D DOC 123 of the DQS clock in the MRS 122. The 3-D DOC 123 stored in the MRS 122 may be provided to the memory controller 110 by a mode register read command issued by the memory controller 110.

The data I/O circuit 126 may transmit the read data DQ synchronized with the DQS clock to the memory controller 110 and receive write data DQ synchronized with the DQS clock from the memory controller 110. The data DQ transmitted and received by the data I/O circuit 126 may include a data width of 8 bits. According to an example embodiment, the data width may be 16 bits, and the 16 bits may be divided into lower bytes of 8-bit data and higher bytes of 8-bit data. Accordingly, the DQS clock may be divided into a low byte DQS clock and a high byte DQS clock to be used.

Figure 2:
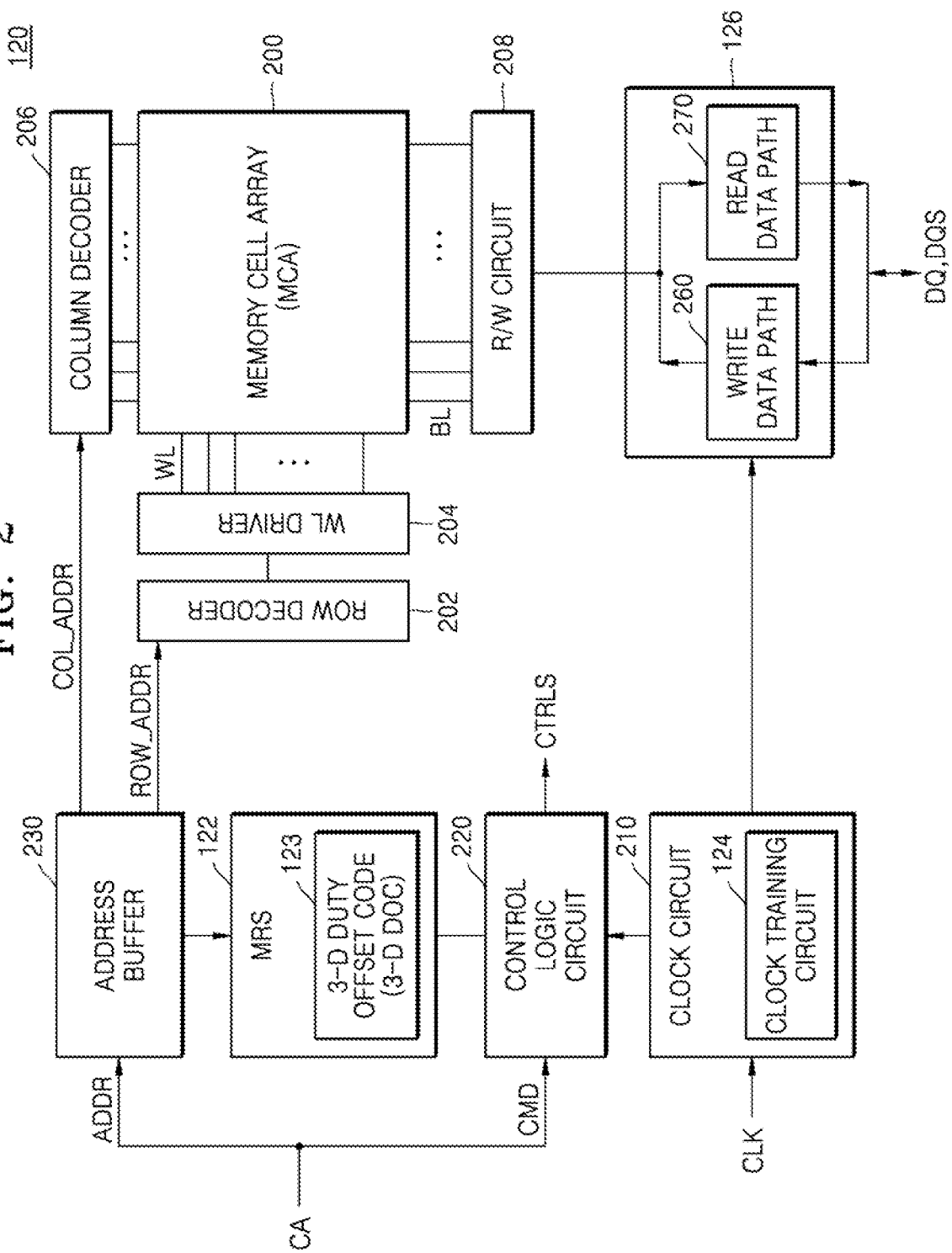
FIG. 2 is a block diagram illustrating a memory device according to an example embodiment.

FIG. 2 is a block diagram illustrating the memory device 120 according to an example embodiment.

Referring to FIGS. 1 and 2, the memory device 120 may include a memory cell array (MCA) 200, a row decoder 202, a word line (WL) driver 204, a column decoder 206, a read/write (R/W) circuit 208, a clock circuit 210, a control logic circuit 220, an address buffer 230, an MRS 122, and a data I/O circuit 126.

In an example embodiment, the MCA 200 includes a plurality of memory cells provided in a matrix form arranged in rows and columns. The MCA 200 includes a plurality of word lines WL and a plurality of bit lines BL respectively connected to the memory cells. The word lines WL may be respectively connected to rows of the memory cells, and the bit lines BL may be respectively connected to columns of the memory cells.

The row decoder 202 may select any one of the word lines WL connected to the MCA 200. The row decoder 202 decodes a row address ROW_ADDR received through the CA bus 130 and the address buffer 230 to select any one word line WL corresponding to the row address ROW_ADDR and connect the selected word line WL to the word line driver 204 activating the selected word line WL. The column decoder 206 may select certain bit lines BL among the bit lines BL of the MCA 200. The column decoder 206 may decode the column address COL_ADDR received from the address buffer 230 to generate a column selection signal, and connect bit lines BL selected by the column selection signal to the R/W circuit 208.

The R/W circuit 208 may include read data latches for storing read data of the bit lines BL selected by the column selection signal, and a write driver for writing write data to the MCA 200. The read data stored in the read data latches of the R/W circuit 208 may be provided to the data (DQ) bus 130 through a data output driver of the read data path 270. The write data may be applied to the MCA 200 through a data input buffer of the write data path 260 connected to the data (DQ) bus 130 and through a write driver of the R/W circuit 208.

The clock circuit 210 may receive a CLK clock through the clock bus 130, and may generate an internal clock signal. The internal clock signal may include clock signals (e.g., ICLK, QCLK, IBCLK, and QBCLK) described as the multi-phase clock with reference to FIG. 3. The internal clock signals ICLK, QCLK, IBCLK, and QBCLK may be used for various operation timings of internal circuits of the memory device 120. The clock circuit 210 may monitor the DQS clock provided by the read data path 270 using the internal clock signals ICLK, QCLK, IBCLK, and QBCLK and adjust a DQS clock timing. The clock circuit 210 may include a clock training circuit 124 receiving the CLK clock to generate a multi-phase clock and simultaneously phase-sweeping each of the three internal clock signals in the multi-phase clock by a duty adjustment step to generate a 3-D DOC for the multi-phase clock.

The control logic circuit 220 may receive a command CMD through the CA bus 130, and generate a control signal CTRLS for controlling an operation timing and/or a memory operation of the memory device 120. The control logic circuit 220 may read data from the MCA 200 and write data to the MCA 200 using the control signal CTRLS.

The MRS 122 may store information used by the control logic circuit 220 to configure an operation of the memory device 120 to set an operating condition for the memory device 120. The MRS 122 may include a register that stores parameter codes and/or 3-D DOCs for various operating and control parameters used to set operating conditions of the memory device 120. The parameter codes and/or the 3-D DOCs may be received by the memory device 120 through the CA bus 130. The control logic circuit 220 provides control signals CTRLS to circuits of the memory device 120 to operate as set in operating and control parameters and/or the 3-D DOC stored by the MRS 122.

The data I/O circuit 126 may be divided into a write data path 260 portion including a data input buffer and a read data path 270 portion including a data output driver. The write data path 260 may include a flip-flop that receives the write data DQ. The read data path 270 may include a flip-flop for transmitting the read data DQ. Additionally, the read data path 270 may include circuits performing various functions related to a read operation, such as output drive strength, preamble/postamble length, pull-down/on die termination (ODT), and pull-up/output high level voltage (Voh) calibration, pre-emphasis, and the like. The pull-down/ODT and pull-up/Voh calibration may be provided to improve signal integrity (SI) by adjusting a swing width and/or drive strength of signals received through the CA bus 130 and/or the data (DQ) bus 130. The pre-emphasis function may be provided to improve SI by increasing a data eye opening region of a signal transmitted through the data (DQ) bus 130. The read data path 270 may have a propagation delay factor longer than the write data path 260.

Figure 3A:
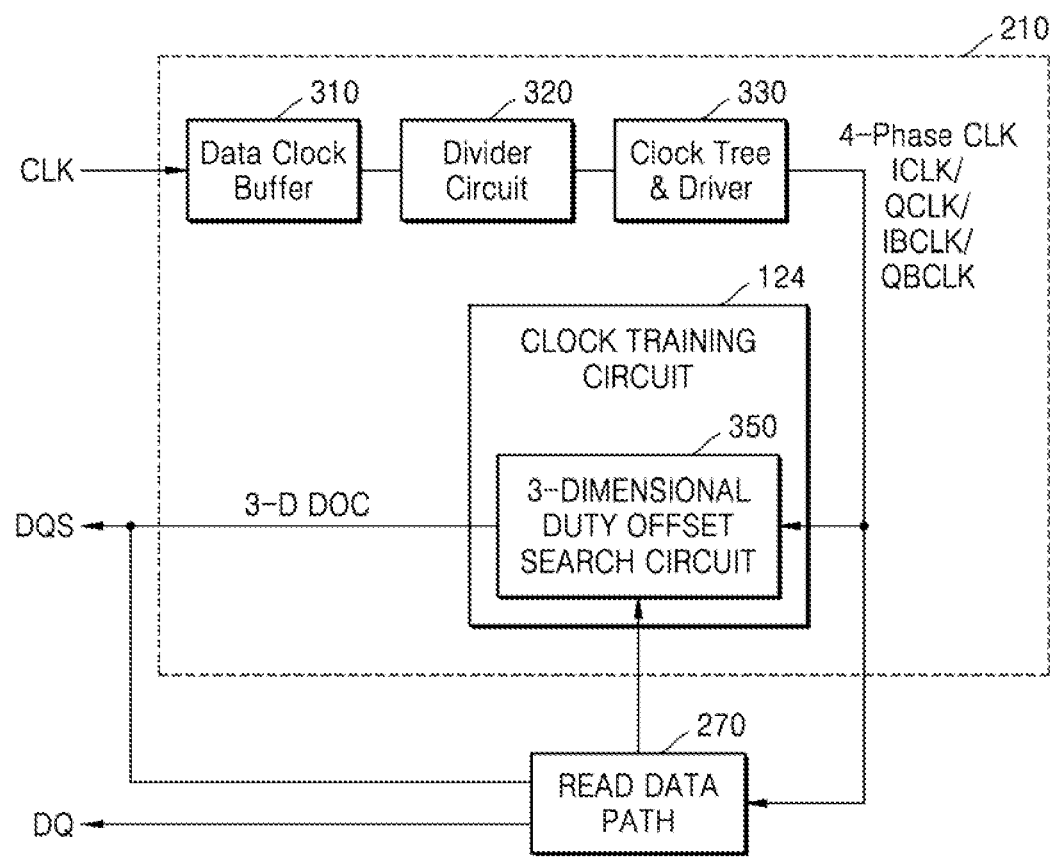
FIGS. 3A and 3B are block diagrams of a clock circuit according to an example embodiment.
Figure 3B:
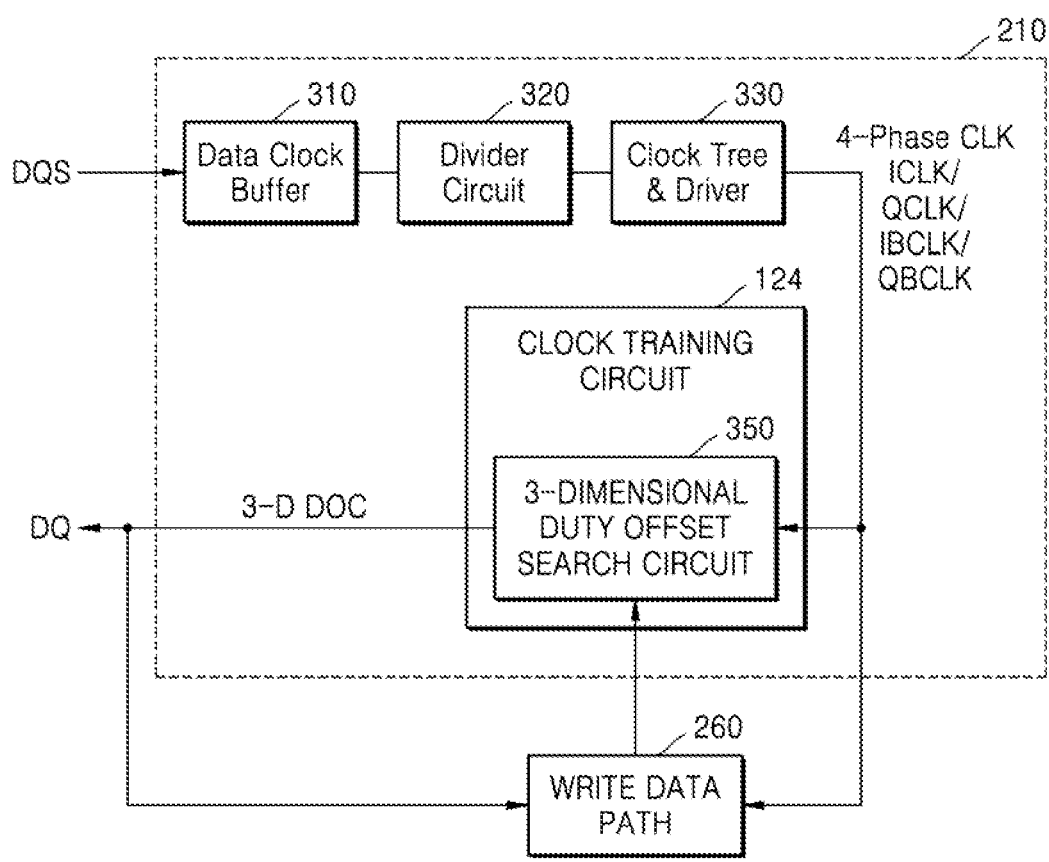
Figure 4:
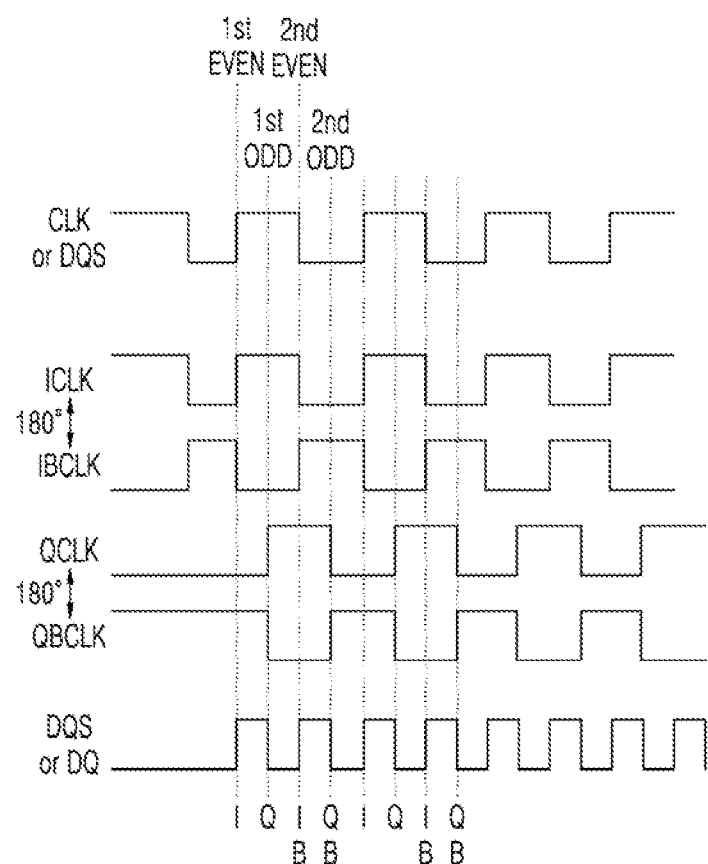
FIG. 4 is a diagram illustrating a multi-phase clock including an internal clock signal of FIG. 3.

FIGS. 3A and 3B are block diagrams of the clock circuit 210 according to an example embodiment. FIG. 4 is a diagram illustrating a multi-phase clock including internal clock signals ICLK/QCLK/IBCLK/QBCLK of FIGS. 3A and 3B.

The clock circuit 210 of FIGS. 3A and 3B may be connected to a portion of the read data path 270 and/or the write data path 260 of the memory device 120 of FIG. 2.

Referring to FIGS. 2 and 3A, the clock circuit 210 may include a clock buffer 310 (e.g., a data clock buffer), a divider circuit 320, a clock tree and driver circuit 330, and a clock training circuit 124.

The clock buffer 310 may buffer an external CLK clock, and provide the buffered CLK clock to the divider circuit 320.

The divider circuit 320 may provide multi-phase clocks derived from the CLK clock.

The multi-phase clocks may have a phase relationship with respect to each other. As an example, the divider circuit 320 may generate four internal clock signals ICLK/QCLK/IBCLK/QBCLK having a phase relationship of 90 degrees (0 degrees, 90 degrees, 180 degrees, 270 degrees, etc.) with respect to each other.

For convenience of description, the four internal clock signals ICLK/QCLK/IBCLK/QBCLK may be used interchangeably as multi-phase clocks. However, the present embodiment is not limited to this particular number of internal clock signals, phase relationships, and/or clock frequencies.

The multi-phase clocks of the divider circuit 320 may be provided to a circuit that may operate according to the corresponding internal clock signals ICLK/QCLK/IBCLK/QBCLK through the clock tree and driver circuit 330. For example, the internal clock signals ICLK/QCLK/IBCLK/QBCLK may be provided to the read data path 270 of the data I/O circuit 126 by the clock tree and driver circuit 330 for a timing of the operation of transmitting the read data.

The clock tree and driver circuit 330 may generate a DQS clock based on the internal clock signals ICLK/QCLK/IBCLK/QBCLK. The DQS clock may provide a timing of a read data transmission operation performed in the read data path 270.

In the clock circuit 210, for data having a data width including lower and upper bytes, a separate clock path may be provided for the internal clock signals ICLK/QCLK/IBCLK/QBCLK associated with each byte. In an example embodiment, each clock path includes circuits for individually monitoring the internal clock signals ICLK/QCLK/IBCLK/QBCLK for each data byte. For example, the clock training circuit 124 is included for providing, timing adjustment, and monitoring an internal clock signal for a first byte of data, and at least a portion of the clock training circuit 124 may be duplicated for providing, timing adjustment, and monitoring an internal clock signal for a second byte of the data. For convenience of description, the clock circuit 210 is described in connection with the operation of providing, timing adjustment, and monitoring of the internal clock signal for the first byte data, but the same may be applied to the second byte data.

The internal clock signals ICLK/QCLK/IBCLK/QBCLK provided from the clock tree and driver circuit 330 may have the same or different phases with respect to an external CLK clock, as shown in FIG. 4. As an example, the ICLK clock may have the same phase as that of the CLK clock, the ICLK clock may have a phase difference of 180 degrees from that of the IBCLK clock, and the QCLK clock may have a phase difference of 180 degrees from that of the QBCLK clock. A DQS clock frequency may be twice a CLK clock frequency. The DQS clock may be configured to have a first even edge I synchronized with a rising edge of the ICLK clock, a first odd edge Q synchronized with a rising edge of the QCLK clock, a second even edge IB synchronized with a rising edge of the IBCLK clock, and a second odd edge QB synchronized with a rising edge of the QBCLK clock. FIG. 4 shows a DQS clock having an ideal 50% duty cycle.

Figure 6:
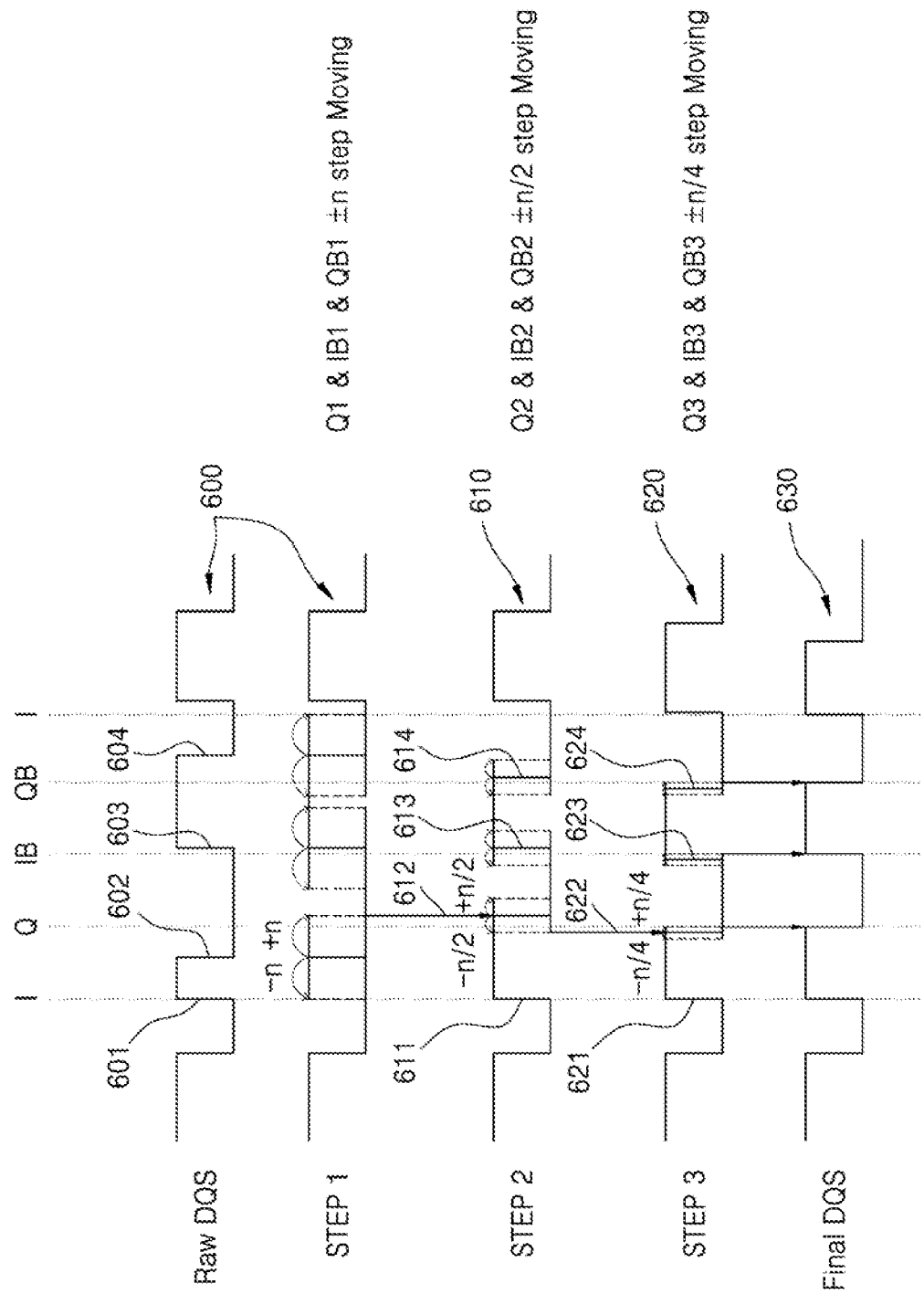
FIGS. 6 and 7A to 7D are diagrams illustrating an operation of a 3-D duty offset search circuit of FIG. 3.

In general, the clock tree and driver circuit 330 of FIG. 3 may have a unique circuit characteristic that causes an undesirable timing change when providing the internal clock signals ICLK/QCLK/IBCLK/QBCLK. This unique circuit characteristic may deviate from ideal circuit characteristics due to, e.g., variations in a manufacturing process and operating variations due to changes in temperature and voltage. For example, when the clock tree and driver circuit 330 provides the internal clock signals ICLK/QCLK/IBCLK/QBCLK, a duty cycle may be changed so that the internal clock signals ICLK/QCLK/IBCLK/QBCLK may have a distorted duty cycle, compared with an external CLK clock. A timing of the internal clock signals ICLK/QCLK/IBCLK/QBCLK having a distorted duty cycle may cause undesirable performance of a circuit operating according to the internal clock signals ICLK/QCLK/IBCLK/QBCLK. As an example, as shown in FIG. 6, a raw DQS clock 600 having a 50% distorted duty ratio may be generated by the internal clock signals ICLK/QCLK/IBCLK/QBCLK having a distorted duty cycle. The raw DQS clock 600 of FIG. 6 may cause a malfunction in the read data path 270.

The clock training circuit 124 may generate a DQS clock by adjusting the timing of the internal clock signals ICLK/QCLK/IBCLK/QBCLK provided by the clock tree and driver circuit 330. The clock training circuit 124 may simultaneously sweep the internal clock signals ICLK/QCLK/IBCLK/QBCLK with a duty adjustment step within a certain range. The clock training circuit 124 may include a 3-D duty offset search circuit 350 generating an optimal duty offset code (3-D DOC) for the DOS clock by simultaneously sweeping three internal clock signals (e.g., QCLK/IBCLK/QBCLK) among the internal clock signals ICLK/QCLK/IBCLK/QBCLK with a certain duty adjustment.

The 3-D duty offset search circuit 350 may provide the duty offset code (3-D DOC) related to the DQS clock to the memory controller 110 (FIG. 1) through the bus (FIG. 1) connected to the data DQ line or the DQS clock line. The memory controller 110 may adjust the CLK clock using the duty offset code (3-D DOC) for the DQS clock associated with the read data DQ of the read data path 270 of the memory device 120 to have an ideal 50% duty cycle, and provide the adjusted CLK clock to the memory device 120. In another implementation, the memory controller 110 may provide the duty offset code (3-D DOC) by the training circuit 112 to the mode register 122 of the memory device 120, as clock duty offset information. The clock duty offset information may be programmed as opcodes in the mode register 122, and the opcodes may correspond to specific bits of the second mode register 122b.

Referring to FIG. 3B, the clock circuit 210 may be configured to receive an external DQS clock and generate an optimal duty offset code (3-D DOC) for write data DQ using the 3-D duty offset search circuit 350. The clock buffer 310 may buffer the external DQS clock, and the divider circuit 320 and the clock tree and driver circuit 330 may generate internal clock signals ICLK/QCLK/IBCLK/QBCLK derived from the DQS clock. The clock training circuit 124 may adjust a timing of the internal clock signals ICLK/QCLK/IBCLK/QBCLK provided by the clock tree and driver circuit 330 and receive the write data DQ, in response to the timing-adjusted internal clock signals ICLK/QCLK/IBCLK/QBCLK. The 3-D duty offset search circuit 350 may sweep three internal clock signals (e.g., QCLK/IBCLK/QBCLK), among the internal clock signals ICLK/QCLK/IBCLK/QBCLK, simultaneously with a certain duty adjustment step to generate an optimal duty offset code (3-D DOC) for the data DQ The 3-D duty offset search circuit 350 may provide the duty offset code (3-D DOC) related to the write data DQ to the memory controller 110 (FIG. 1) through the data DQ line or the bus 130 (FIG. 1) connected to the DQS clock line. In order for the write data DQ of the write data path 260 of the memory device 120 to have an ideal 50% duty cycle using the duty offset code 3-D DOC, the memory controller 110 may adjust the DQS clock and provide the adjusted DQS clock to the memory device 120.

Figure 5:
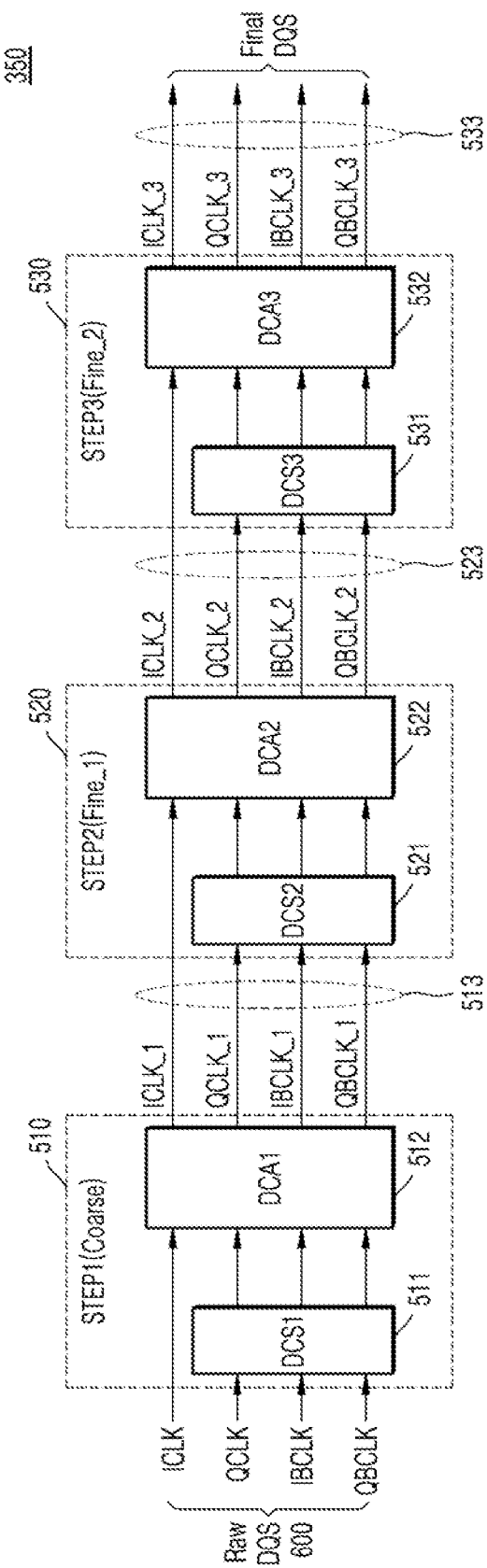
FIG. 5 is a block diagram illustrating a three-dimensional (3-D) duty offset search circuit of FIG. 3.

FIG. 5 is a block diagram illustrating the 3-D duty offset search circuit 350 of FIG. 3. FIGS. 6 and 7A to 7D are diagrams illustrating the operation of the 3-D duty offset search circuit 350 of FIG. 3.

Referring to FIGS. 3 and 5, the 3-D duty offset search circuit 350 may include a first duty adjusting unit 510, a second duty adjusting unit 520, and a third duty adjusting unit 530.

In an implementation, the 3-D duty offset search circuit 350 may be implemented by software, that is, as program code, and the clock training circuit 124 may execute the program code in which the operation of the 3-D duty offset search circuit 350 is described.

Hereinafter, subscripts (e.g., a in 710a, a in 720a, and a in 730a) of reference numbers are used to distinguish between a plurality of circuits having the same function.

The first duty adjusting unit 510 may receive the internal clock signals ICLK, QCLK, IBCLK, and QBCLK provided by the clock tree and driver circuit 330. As illustrated in FIG. 4, a DQS clock having a first even edge I synchronized with a rising edge of the ICLK clock, a first odd edge Q synchronized with a rising edge of the QCLK clock, a second even edge IB synchronized with a rising edge of the IBCLK clock, and a second odd edge QB synchronized with a rising edge of the QBCLK clock is generated, and here, the raw DQS clock 600 (FIG. 6) having a 50% distorted duty ratio as illustrated in FIG. 6 may be generated.

The first duty adjusting unit 510 may include a first duty sweep circuit (DCS1, 511, hereinafter referred to as a "first DCS circuit") and a first duty control circuit (DCA1, 512, hereinafter referred to as a "first DCA circuit"). The first duty adjusting unit 510 may perform a first step operation STEP1 of FIGS. 6 and 7A on the raw DQS clock 600. The first step operation STEP1 may be referred to as a coarse duty cycle adjustment operation for the raw DQS clock 600. The first duty adjusting unit 510 may not perform a coarse duty cycle adjustment operation on the ICLK clock among the internal clock signals ICLK, QCLK, IBCLK, and QBCLK related to the raw DQS clock 600 but perform a coarse duty cycle adjustment operation on the other three internal clock signals QCLK, IBCLK, and QBCLK. The ICLK clock may act as a reference clock for the three internal clock signals QCLK, IBCLK, and QBCLK that are coarse duty cycle adjusted.

The first DCS circuit 511 may simultaneously sweep the phases of the internal clock signals QCLK, IBCLK, and QBCLK to a first adjustment range. The first adjustment range may include an adjustment range of −n to +n (n is a non-zero whole number) step. As an example, the first adjustment range may be set to −7 to +7 steps.

Adjusting the phases between the internal clock signals QCLK, IBCLK, and QBCLK means, in the first step operation STEP1 of FIG. 6, except for an I edge 601, phase-sweeping in −n to +n steps based on a Q edge 602, phase-sweeping in −n to +n steps based on an IB edge 603, and phase-sweeping in −n to +n steps based on a QB edge 604. In addition, adjusting the phases between the internal clock signals QCLK, IBCLK, and QBCLK means phase-sweeping in −n to +n steps based on a Q axis indicating the Q edge 602 in the first step operation STEP1 of FIG. 7A, phase-sweeping in −n to +n steps based on an IB axis indicating the IB edge 602, and phase-sweeping in −n to +n steps based on a QB axis indicating the QB edge 603. The first step operation STEP1 of FIG. 7A may have 27 (=3*3*3) phase offset points 710.

As the first DCS circuit 511 performs phase sweeping of the internal clock signals QCLK, IBCLK, and QBCLK in −n to +n steps, each of the internal clock signals QCLK, IBCLK, and QBCLK may be toggled with a certain pulse width. The first DCA circuit 512 may merge the pulse width of each of the internal clock signals QCLK, IBCLK, and QBCLK appearing at each of the phase offset points 710 of FIG. 7A, when the first DCS circuit 511 performs phase sweeping in −n to +n steps. The first DCA circuit 512 may select the largest value among merged pulse width windows of the internal clock signals QCLK, IBCLK, and QBCLK. The first DCA circuit 512 may select a first phase offset point 710a having the largest merged pulse width window.

The first phase offset point 710*a* is an optimal duty adjustment point for adjusting a duty cycle of the DQS clock 600 in the first step operation STEP1. A coarse duty-adjusted DQS clock 610 at the first phase offset point 710*a* may be provided. The first DCA circuit 512 may capture the first phase offset point 710*a* and output the first internal clock signals ICLK_1, QCLK_1, IBCLK_1, and QBCLK_1 including the first phase offset point 710*a* as a first duty adjustment result 513. The first duty adjustment result 513 may be provided as a coarse duty-adjusted DQS clock 610 to the second duty adjusting unit 520.

The second duty adjusting unit 520 may include second DCS circuits DCS2 521 and a second DCA circuit DCA2 522. The second step operation STEP2 of FIGS. 6 and 7B may be performed on the coarse duty-adjusted DQS clock 610 by the second duty adjusting unit 520. The second step operation STEP2 may be referred to as a first fine duty cycle adjustment operation for the DQS clock 610. The second duty adjusting unit 520 does not perform the first fine duty cycle adjustment operation on the ICLK_1 clock, among the first internal clock signals ICLK_1, QCLK_1, IBCLK_1, and QBCLK_1 related to the DQS clock 610 and may perform the first fine duty cycle adjustment operation on the other three first internal clock signals QCLK_1, IBCLK_1, and QBCLK_1. The ICLK_1 clock may serve as a reference clock for the three first internal clock signals QCLK_1, IBCLK_1, and QBCLK_1 that are first fine duty cycle adjusted.

The second DCS circuit 521 may simultaneously sweep the phases between the first internal clock signals QCLK_1, IBCLK_1, and QBCLK_1 to the second adjustment range. The second adjustment range may include an adjustment range of −n/2 to +n/2 (n/2 is a non-zero whole number) step. For example, the second adjustment range may be set to −3 to +3 steps.

In the second step operation STEP2 of FIG. 6, except for an I edge 611, phase sweeping may be performed in −n/2 to +n/2 steps based on a Q edge 612, phase sweeping may be performed in −n/2 to +n/2 steps based on an IB edge 613, and phase sweeping may be performed in −n/2 to +n/2 steps based on a QB edge 614. In the second step operation STEP2 of FIG. 7B, with the first phase offset point 710*a* as the origin, phase sweeping may be performed in −n/2 to +n/2 steps based on a Q axis indicating the Q edge 612, phase sweeping may be performed in-n/2 to +n/2 steps based on an IB axis indicating the IB edge 613, and phase sweeping may be performed in −n/2 to +n/2 steps based on a QB axis indicating the QB edge 614. The second step operation STEP2 of FIG. 7B may have 27 (=3*3*3) second phase offset points 720.

As the second DCS circuit 521 performs phase sweeping between the first internal clock signals QCLK_1, IBCLK_1, and QBCLK_1 in −n/2 to +n/2 steps, each of the first internal clock signals QCLK_1, IBCLK_1, and QBCLK_1 may be toggled with a certain pulse width. When the second DCS circuit 521 performs phase sweeping in −n/2 to +n/2 steps, the second DCA circuit 522 may merge pulse widths of the first internal clock signals QCLK_1, IBCLK_1, and QBCLK_1 respectively appearing in each of the second phase offset points 720 of FIG. 7B. The second DCA circuit 522 may select the largest value among the merged pulse width windows of the first internal clock signals QCLK_1, IBCLK_1, and QBCLK_1. The second DCA circuit 522 may select the second phase offset point 720*a* having the largest merged pulse width window.

The second phase offset point 720*a* is an optimal duty adjustment point for adjusting the duty cycle of the DQS clock 610 in the second step operation STEP2. The first fine duty adjusted DQS clock 620 may be provided at the second phase offset point 720*a*. The second DCA circuit 522 may capture the second phase offset point 720*a* and output the second internal clock signals ICLK_2, QCLK_2, IBCLK_2, and QBCLK_2 including the second phase offset point 720*a* as a second duty adjustment result 523. The second duty adjustment result 523 may be provided as a first fine-duty-adjusted DQS clock 620 to the third duty adjusting unit 530.

The third duty adjusting unit 530 may include third DCS circuits DCS3 531 and third DCA circuits DCA3 532. A third step operation STEP3 of FIGS. 6 and 7C may be performed on the first fine-duty-adjusted DQS clock 620 by the third duty adjusting unit 530. The third step operation STEP3 may be referred to as a second fine duty cycle adjustment operation for the DQS clock 620. The third duty adjusting unit 530 may not perform the second fine duty cycle adjustment operation on the ICLK_2 clock, among the second internal clock signals ICLK_2, QCLK_2, IBCLK_2, and QBCLK_2, and may perform the second fine duty cycle adjustment operation on the other three second internal clock signals QCLK_2, IBCLK_2, and QBCLK_2. The ICLK_2 clock may serve as a reference clock for the three second internal clock signals QCLK_2, IBCLK_2, and QBCLK_2 that are second fine-duty-adjusted.

The third DCS circuit 531 may simultaneously sweep the phases between the second internal clock signals QCLK_2, IBCLK_2, and QBCLK_2 to the third adjustment range. The third adjustment range may include an adjustment range of −n/4 to +n/4 (n/4 is a non-zero whole number) steps. As an example, the third adjustment range may be set in −1 to +1 steps.

In the third step operation STEP3 of FIG. 6, except for the I edge 621, phase sweeping may be performed in −n/4 to +n/4 steps based on a Q edge 622, phase sweeping may be performed in −n/4 to +n/4 steps based on an IB edge 623, and phase sweeping may be performed in −n/4 to +n/4 steps based on a QB edge 624. In the third step operation (STEP3) of FIG. 7C, based on the second phase offset point 720*a* as the origin, phase sweeping may be performed in −n/4 to +n/4 steps based on the Q axis indicating the Q edge 622, phase sweeping may be performed in −n/4 to +n/4 steps based on the IB axis indicating the IB edge 623, and phase sweeping may be performed in −n/4 to +n/4 steps based on the QB axis indicating the QB edge 624. The third step operation STEP3 of FIG. 7C may have 27 (=3*3*3) third phase offset points 730.

As the third DCS circuit 531 performs phase-sweeping on the second internal clock signals QCLK_2, IBCLK_2, QBCLK_2 in −n/4 to +n/4 steps, each of the second internal clock signals QCLK_2, IBCLK_2, and QBCLK_2 may be toggled with a certain pulse width. The third DCA circuit 532 may merge the pulse width of each of the second internal clock signals QCLK_2, IBCLK_2, and QBCLK_2 appearing at each of the third phase offset points 710 of FIG. 7C, when the third DCS circuit 531 performs phase sweeping in −n/4 to +n/4 steps. The third DCA circuit 532 may select the largest value among the merged pulse width windows of the second internal clock signals QCLK_2, IBCLK_2, and QBCLK_2. The third DCA circuit 532 may select the third phase offset point 730*a* having the largest merged pulse width window.

The third phase offset point 730*a* is an optimal duty adjustment point for adjusting the duty cycle of the DQS clock 620 in the third step operation STEP3. A second fine-duty-adjusted DQS clock 630 may be provided at the third phase offset point 730*a*. The third DCA circuit 532 may capture the third phase offset point 730a and output the third internal clock signals ICLK_3, QCLK_3, IBCLK_3, and QBCLK_3 including the third phase offset point 730a as a third duty adjustment result 533. The third duty adjustment result 533 may be output as a final DQS clock 630 having a 50% duty cycle adjusted. The final DQS clock 630 may be provided to the memory controller 110 (FIG. 1) through the bus 130 (FIG. 1) connected to the DQS clock line.

Figure 7A:
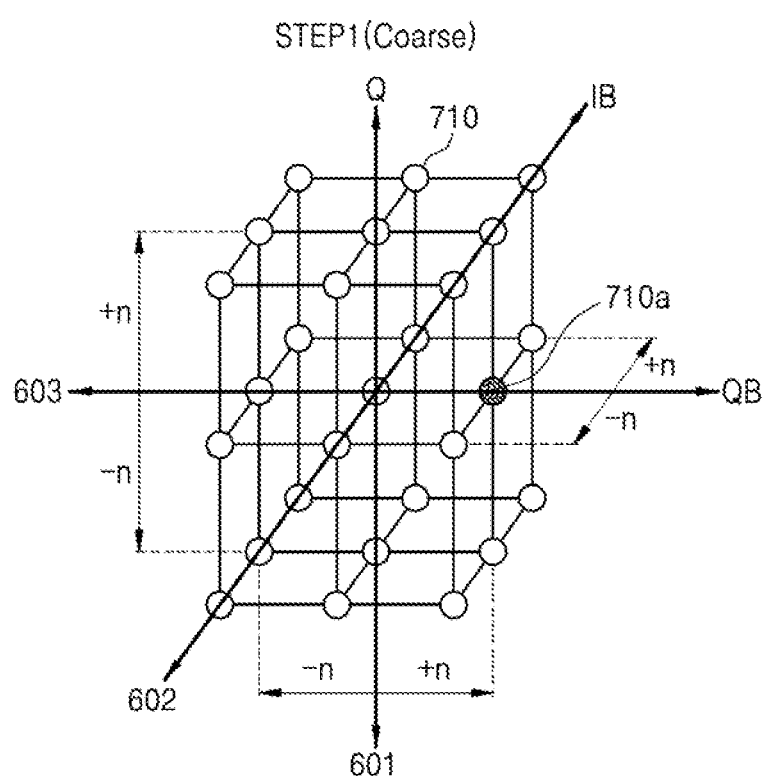
Figure 7B:
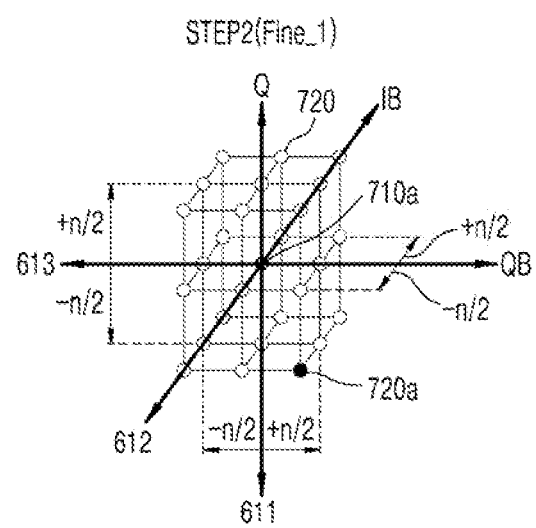
Figure 7C:
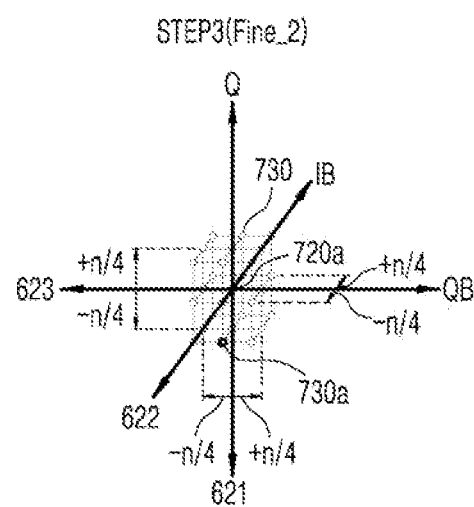
Figure 7D:
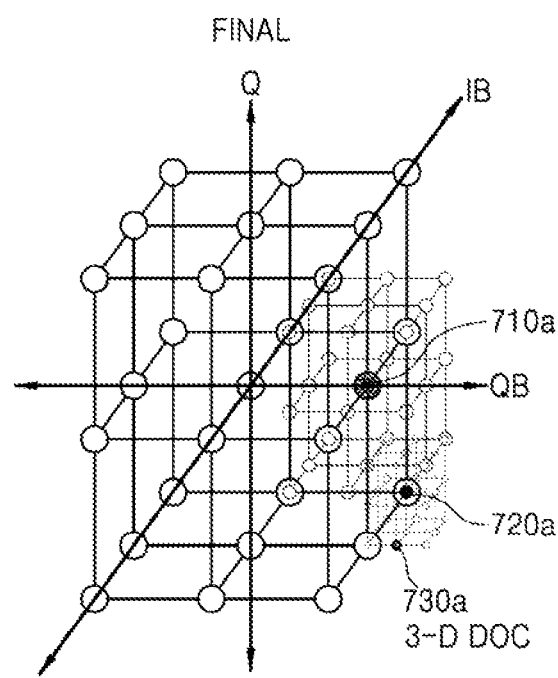

The 50% duty cycle adjusted final DQS clock 630 may be provided at the third phase offset point 730a. As shown in FIG. 7D, the third phase offset point 730a may be obtained as a result of phase-sweeping the internal clock signals QCLK, IBCLK, and QBCLK related to the raw DQS clock 600 by a certain step value according to performing of the first to third step operations STEP1, STEP2, and STEP3 of FIGS. 7A to 7C. The certain step value representing the third phase offset point 730a may be indicated by a 3-D DOC of the DQS clock 600. The 3-D duty offset search circuit 350 may provide the 3-D DOC to the memory controller 110 through the bus 130 connected to the data DQ line or the DQS clock line.

FIGS. 8 and 9 are diagrams illustrating the operation of the clock training circuit 124 according to an example embodiment.

Referring to FIGS. 3, 4, and 8, the clock training circuit 124 may perform first to fifth step operations STEP1, STEP2, STEP3, STEP4, and STEP5 by expanding the first to third step operations STEP1, STEP2, and STEP3 described above with reference to FIGS. 6 and 7A to 7D. The first to fifth step operations STEP1, STEP2, STEP3, STEP4, and STEP5 may be executed by a program code in which the operation of the 3-D duty offset search circuit 350 described above with reference to FIGS. 5 to 7D is described.

In the first step operation STEP1, a first duty cycle adjustment operation may be performed on a raw DQS clock 800 generated based on the internal clock signals ICLK, QCLK, IBCLK, and QBCLK provided by the clock tree and driver circuit 330. The first duty cycle adjustment operation may be performed for three internal clock signals QCLK, IBCLK, and QBCLK, among the internal clock signals ICLK, QCLK, IBCLK, and QBCLK related to the raw DQS clock 800.

In the first duty cycle adjustment operation, the phases between the internal clock signals QCLK, IBCLK, and QBCLK may be phase-swept in an adjustment range of −7 to +7 steps. As shown in FIG. 9, the QCLK clock has an adjustment range of {−7, 0, 7}, the IBCLK clock has an adjustment range of {−7, 0, 7}, and the QBCLK clock has an adjustment range of {−7, 0, 7}. The adjustment ranges of these QCLK, IBCLK, and QBCLK clocks may be applied simultaneously. Accordingly, the first phase offset point 710a may be selected by evaluating an optimal duty adjustment point for adjusting a duty cycle of the DQS clock 800, among the 27 phase offset points 710 (FIG. 7A).

In the first step operation STEP1, the optimal duty adjustment point may be evaluated using the largest value, among the merged pulse width windows of the internal clock signals QCLK, IBCLK, and QBCLK. For example, the first phase offset points {Q1, IB1, QB1} 710a may be determined as {−7, 0, 0}. A duty-adjusted DQS clock 810 may be generated based on the first phase offset point {−7, 0, 0}.

In the second step operation STEP2, a second duty cycle adjustment operation may be performed on the DQS clock 810 whose duty is adjusted based on the first phase offset point {−7, 0, 0}. In the second duty cycle adjustment operation, the phases between the internal clock signals QCLK, IBCLK, and QBCLK related to the DQS clock 810 may be phase-swept in an adjustment range of −4 to +4 steps. As shown in FIG. 9, the QCLK clock has an adjustment range of {−4, 0, 4} based on the Q1 {−7} phase offset point as the origin, the IBCLK clock has an adjustment range of {−4, 0, 4} based on the IB1 {0} phase offset point as the origin, and the QBCLK clock has an adjustment range of {−4, 0, 4} based on the QB1 {0} phase offset point as the origin. The adjustment ranges of these QCLK, IBCLK, and QBCLK clocks may be applied simultaneously, and, among the 27 phase offset points 720 (FIG. 7B), 14 phase points (e.g., {−7, 0, 4)}, {−7, −4, 4}, etc.) outside −4 to +4 steps may be omitted from the optimal duty adjustment point evaluation for the DQS clock 810. Accordingly, the second phase offset point 720a may be selected by evaluating an optimal duty adjustment point for adjusting a duty cycle of the DQS clock 810, among the other 13 phase points (e.g., {−7, 0, 4}, {−7, −4, 0}, etc.). As an example, the second phase offset point {Q2, IB2, QB2} 710a may be determined as {−3, 0, 4}. A duty-adjusted DQS clock 820 may be generated based on the second phase offset point {−3, 0, 4}.

In the third step operation STEP3, a third duty cycle adjustment operation may be performed on the duty-adjusted DQS clock 820 based on the second phase offset point {−3, 0, 4}. In the third duty cycle adjustment operation, the phases between the internal clock signals QCLK, IBCLK, and QBCLK related to the DQS clock 820 may be phase-swept in a range of −3 to +3 steps, an optimal duty adjustment point for adjusting a duty cycle of the DQS clock 820, among 16 phase points (e.g., {−3, 0, 4}, {−3, 0, 1}, etc.), among 27 phase offset points, may be evaluated and determined as a third phase offset point {−3, 3, 1}, and a duty-adjusted DQS clock 830 may be generated based on the third phase offset point {−3, 3, 1}.

In the fourth step operation STEP4, a fourth duty cycle adjustment operation may be performed on the duty-adjusted DQS clock 830 based on the third phase offset point {−3, 3, 1}. In the fourth duty cycle adjustment operation, the phases between the internal clock signals QCLK, IBCLK, and QBCLK related to the DQS clock 830 may be phase-swept in an adjustment range of −2 to +2 steps, and an optimal duty adjustment point for adjusting a duty cycle of the DQS clock 830 among 18 phase points (e.g., {−3, 3, 1}, {−3, 3, 3}, etc.), among 27 phase offset points, is evaluated and determined as a fourth phase offset point {−5, 1, 3}, and a duty-adjusted DQS clock 840 may be generated based on the fourth phase offset point {−5, 1, 3}.

In the fifth step operation STEP5, a fifth duty cycle adjustment operation may be performed on the duty-adjusted DQS clock 840 based on the fourth phase offset point {−5, 1, 3}. In the fifth duty cycle adjustment operation, the phases between the internal clock signals QCLK, IBCLK, and QBCLK related to the DQS clock 830 may be phase-swept in an adjustment range of −1 to +1 steps, and an optimal duty adjustment point for adjusting the duty cycle of the DQS clock 830 among 18 phase points (e.g., {−5, 1, 2}, {−5, 2, 2}, etc.), among 27 phase offset points, is evaluated to select the fifth phase offset point (e.g., 730a). As an example, the fifth phase offset point {Q5, IB5, QB5} 730a may be determined as {−4, 2, 2}.

A 50% duty cycle adjusted final DQS clock 850 may be provided at the fifth phase offset point {−4, 2, 2}. The fifth phase offset point {−4, 2, 2} may be represented by a 3-D DOC of the DQS clock 800. The 3-D DOC may be provided to the memory controller 110 through the bus 130 connected to the data DQ line or the DQS clock line.

Figure 10A:
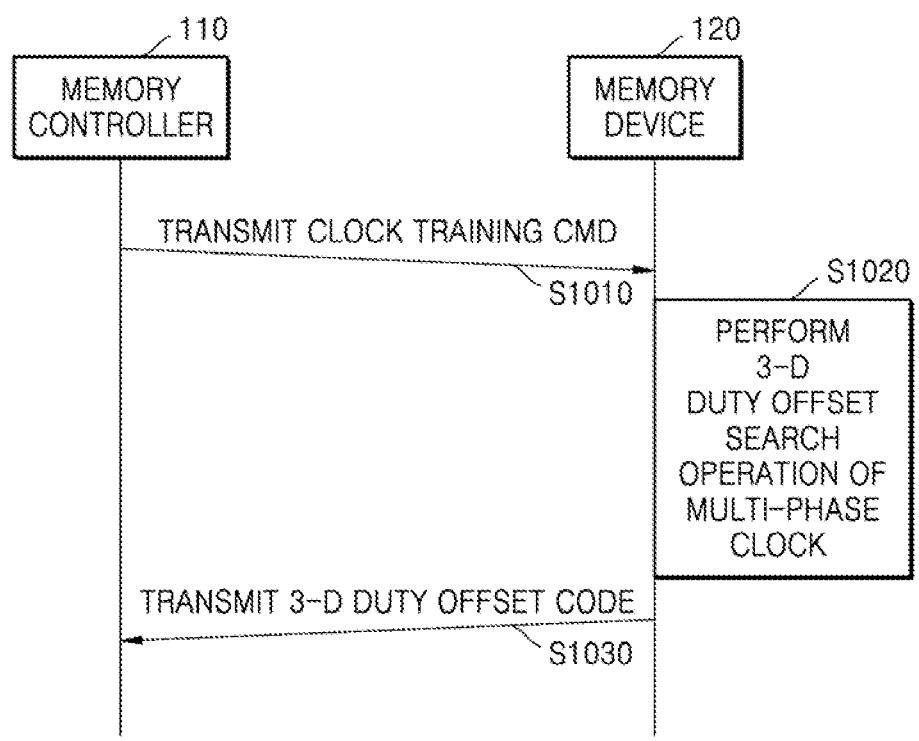
FIGS. 10A, 10B, and 11 are flowcharts illustrating a clock training method according to an example embodiment.
Figure 10B:
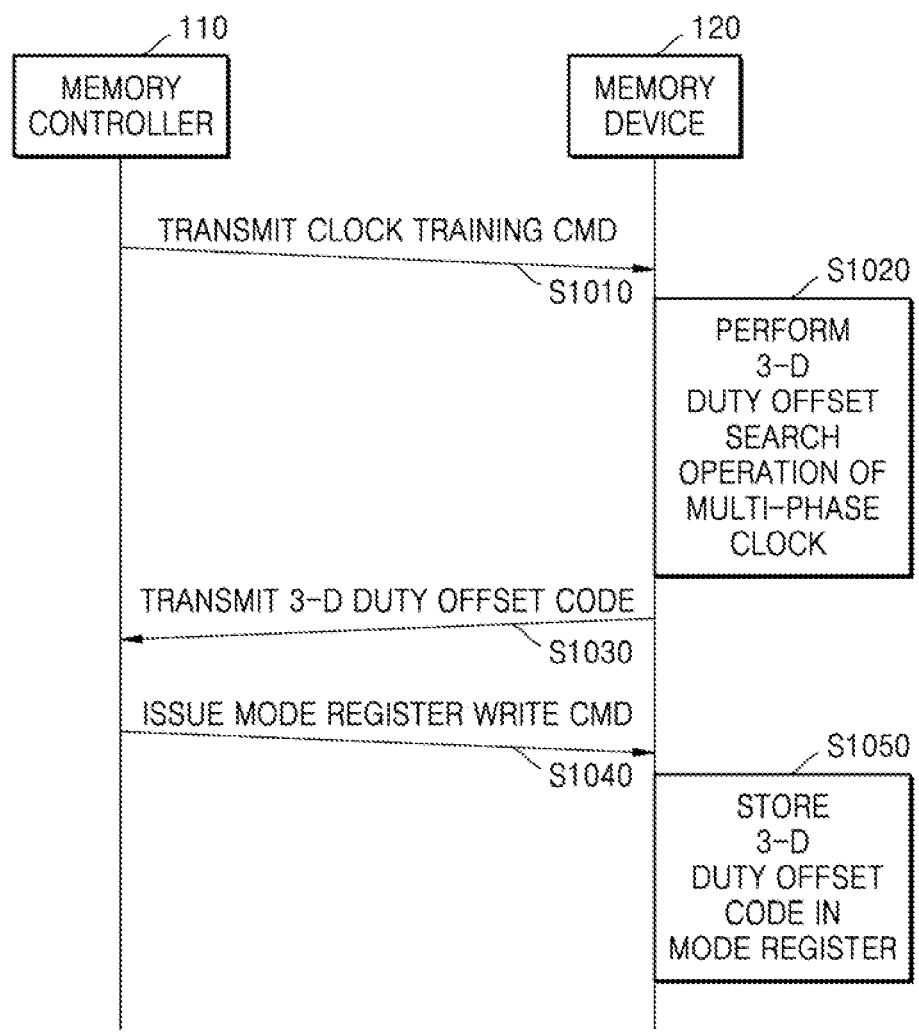
Figure 11:
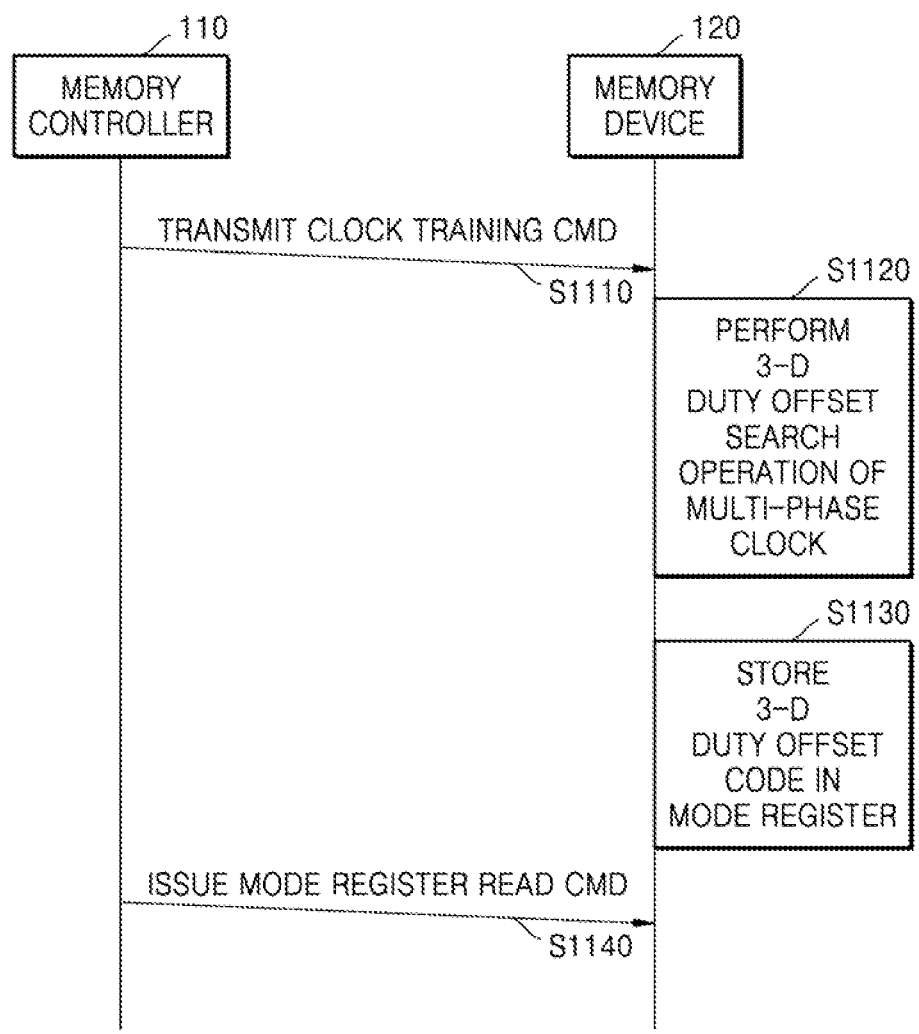

FIGS. 10A, 10B, and 11 are flowcharts illustrating a clock training method according to an example embodiment.

Referring to FIG. 10A in conjunction with FIGS. 1 to 9, in operation S1010, the memory controller 110 may issue a clock training command to the memory device 120.

In operation S1020, the memory device 120 may perform a 3-D duty offset search operation on a multi-phase clock by the clock training circuit 124 in response to a clock training command.

In operation S1030, the memory device 120 may transmit the 3-D DOC (obtained as a result of the 3-D duty offset search operation of the clock training circuit 124) to the memory controller 110. The memory device 120 may transmit the duty offset code (3-D DOC) to the memory controller 110 through the bus 130 connected to the data DQ line or the DQS clock line. Using the duty offset code (3-D DOC), the memory controller 110 may adjust a CLK clock for a DQS clock associated with the read data DQ of the read data path 270 of the memory device 120 to have an ideal 50% duty cycle or adjust a DQS clock for the write data DQ of the write data path 260 of the memory device 120 to have an ideal 50% duty cycle. The memory controller 110 may provide the adjusted CLK clock and/or the DQS clock to the memory device 120.

Referring to FIG. 10B, after operations S1010, S1020, and S1030 described in FIG. 10A are performed, the memory controller 110 may issue a write mode register (MRW) command to the memory device 120 in operation S1040. In order to set an operation condition for the memory device 120, the memory controller 110 may configure information including a memory core parameter code, a peripheral circuit parameter code, and/or a 3-D DOC with appropriate bit values provided through the command/address (CA) bus, and provide the corresponding information to the memory device 120.

In operation S1050, the memory device 120 may store the operation and control parameters and the 3-D DOC received through the command/address (CA) bus in the MRS 122. The memory device 120 may be controlled by the control logic circuit 220 to operate as set in the operation and control parameters of the MRS 122. The control logic circuit 220 may correct the DQS clock duty cycle based on the 3-D DOC of the MRS 122.

Referring to FIG. 11 in conjunction with FIGS. 1 to 9, the memory controller 110 may issue a clock training command to the memory device 120 in operation S1110.

In operation S1120, the memory device 120 may perform a 3-D duty offset search operation on the multi-phase clock by the clock training circuit 124 in response to the clock training command.

In operation S1130, the memory device 120 may store the 3-D DOC obtained as a result of the 3-D duty offset search operation of the clock training circuit 124 in a multi-purpose register (MPR) of the MRS 122.

In operation S1140, the memory controller 110 may issue a mode register read (MRR) command to the memory device 120. The memory device 120 may transmit information including the 3-D DOC stored in the MRS 122 to the memory controller 110 through the data DQ line. The memory controller 110 may provide a CLK clock whose timing is adjusted based on the 3-D DOC (3-D DOC) to the memory device 120.

Figure 12:
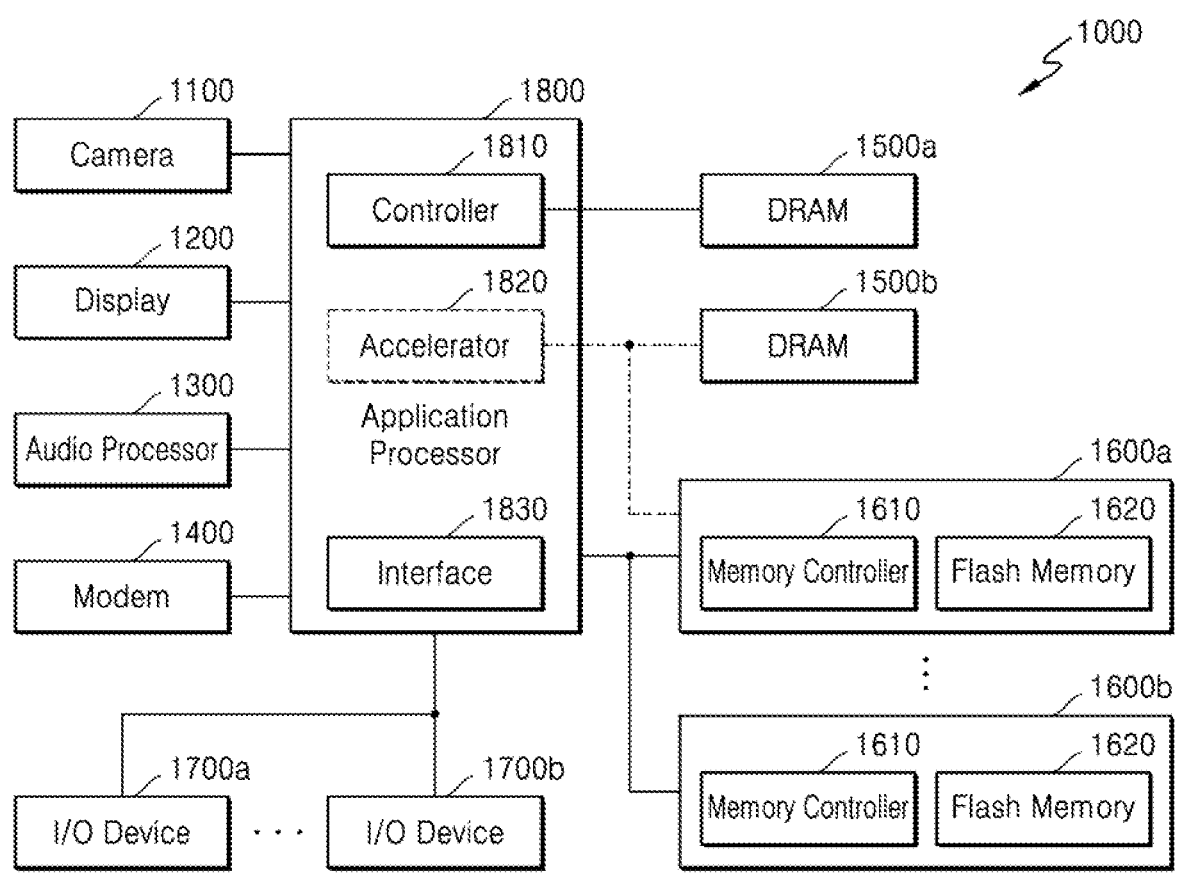
FIG. 12 is a block diagram illustrating a system to which a clock training method according to an example embodiment is applied.

FIG. 12 is a block diagram illustrating a system 1000 to which a clock training method according to an example embodiment is applied.

Referring to FIG. 12, the system 1000 may include a camera 1100, a display 1200, an audio processor 1300, a modem 1400, DRAMs 1500a and 1500b, flash memories 1600a and 1600b, I/O devices 1700a and 1700b, and an AP 1800. The system 1000 may be implemented as, e.g., a laptop computer, a mobile phone, a smartphone, a tablet PC, a wearable device, a healthcare device, an Internet Of things (IOT) device, a server, a PC, etc.

The camera 1100 may capture a still image or video according to the user's control, and may store captured image/video data or transmit the captured image/video data to the display 1200. The audio processor 1300 may process audio data included in the flash memories 1600a and 1600b or content of a network. The modem 1400 may modulate and transmit a signal to transmit/receive wired/wireless data, and may demodulate a signal to restore an original signal thereof at a receiving end. The I/O devices 1700a and 1700b may include devices providing a digital input and/or output function such as a universal serial bus (USB) or storage, a digital camera, a secure digital (SD) card, a digital versatile disc (DVD), a network adapter, and a touch screen.

The AP 1800 may control an overall operation of the system 1000. The AP 1800 may control the display 1200 so that a part of the content stored in the flash memories 1600a and 1600b is displayed on the display 1200. When a user input is received through the I/O devices 1700a and 1700b, the AP 1800 may perform a control operation corresponding to the user input. The AP 1800 may include an accelerator block, which is a dedicated circuit for artificial intelligence (AI) data operation, or may include an accelerator chip 1820 separately from the AP 1800. A DRAM 1500b may be additionally mounted on the accelerator block or the accelerator chip 1820. The accelerator is a function block that professionally performs a certain function of the AP 1800, and the accelerator may include a graphics processing unit (GPU) as a function block that specializes in graphic data processing, a neutral processing unit (NPU) as a block that specializes in AI calculation and inference, and a data processing unit (DPU) as a block that specializes in data transfer.

The system 1000 may include a plurality of DRAMs 1500a and 1500b. The AP 1800 may control the DRAMs 1500a and 1500b through a command and mode register (MRS) setting conforming to the Joint Electron Device Engineering Council (JEDEC) standard, or perform communication by setting a DRAM interface protocol to use company-specific functions such as low voltage/high speed/reliability and a cyclic redundancy check (CRC)/error correction code (ECC) function. For example, the AP 1800 may communicate with the DRAM 1500a through an interface conforming to JEDEC standards such as LPDDR4 and LPDDR5, and the accelerator block or accelerator chip 1820 may perform communication by setting a new DRAM interface protocol to control a DRAM 1500b for an accelerator having a band width higher than the DRAM 1500a.

Although only the DRAMs 1500a and 1500b are illustrated in FIG. 12, example embodiments may use, e.g., any memory of a PRAM, an SRAM, an MRAM, an RRAM, an FRAM or a hybrid RAM as long as a bandwidth, a response speed, and voltage conditions of the AP 1800 or the accelerator chip 1820 are satisfied. The DRAMs 1500a and 1500b have relatively smaller latency and bandwidth than the I/O devices 1700a and 1700b or the flash memories 1600a and 1600b. The DRAMs 1500a and 1500b may be initialized when the system 1000 is powered on and loaded with an operating system and application data to be used as temporary storage locations for the operating system and application data or as execution spaces for various software codes.

In the DRAMs 1500a and 1500b, addition/subtraction/multiplication/division operations, vector operations, address operations, or fast Fourier transform (FFT) operations may be performed. In addition, a function used for inference may be performed in the DRAMs 1500a and 1500b. Here, the inference may be performed in a deep learning algorithm using an artificial neural network. The deep learning algorithm may include a training step of learning a model through various data and an inference step of recognizing data with the learned model. As an example, an image captured by the user through the camera 1100 may be signal-processed and stored in the DRAM 1500b, and the accelerator block or accelerator chip 1820 may perform an AI data calculation to recognize data using the data stored in the DRAM 1500b and the function used in the inference.

The system 1000 may include a plurality of storage or a plurality of flash memories 1600a and 1600b having a larger capacity than the DRAMs 1500a and 1500b. The accelerator block or accelerator chip 1820 may perform a training step and AI data operation by using the flash memories 1600a and 1600b. In an example embodiment, the flash memories 1600a and 1600b may perform the training step and the inference AI data calculation performed by the AP 1800 and/or the accelerator chip 1820 using a calculation device provided in the memory controller 1610. The flash memories 1600a and 1600b may store pictures taken through the camera 1100 or data transmitted through a data network. For example, augmented reality/virtual reality, high definition (HD), or ultra HD (UHD) content may be stored.

In order to reduce a clock training time between the components and find an optimal clock duty cycle, the system 1000 may perform a clock training method of generating a 3-D DOC for a multi-phase clock by simultaneously phase-sweeping three internal clock signals in a multi-phase clock by a duty adjustment step in order to reduce a clock training time between components and search for an optimal clock duty cycle. In an example embodiment, the clock training method includes (i) selecting a first phase offset point among phase offset points for sweeping a phase between internal clock signals in a first adjustment range of −n to +n steps, (ii) selecting a second phase offset point, among phase offset points of sweeping phases between first internal clock signals to a second adjustment range of −n/2 to +n/2 steps based on a first phase offset point as the origin, and iii) selecting a third phase offset point, among phase offset points of sweeping phases of second internal clock signals to a third adjustment range of −n/4 to +n/4 steps based on a second phase offset point as the origin, and providing the same as 3-D DOC.

The camera 1100, display 1200, audio processor 1300, modem 1400, DRAMs 1500a and 1500b, flash memories 1600a and 1600b, I/O devices 1700a and 1700b and/or AP 1800 in the system 1000 may partially or entirely combine the embodiments described above with reference to FIGS. 1 to 11.

By way of summation and review, a semiconductor memory may be generally controlled by providing commands, addresses, and clocks to a memory device. Various commands, addresses, and clock signals may be provided by, e.g., a memory controller. The command may control the memory device to perform various memory operations, e.g., a read operation to retrieve data from the memory device and a write operation to store data in the memory device. Data related to a command may be provided between the memory controller and the memory device at a known timing with respect to reception and/or transmission by the memory device.

A clock, such as a system clock signal and/or a data clock signal, may be provided to the memory device by the memory controller. The system clock may be used for a command and address timing, and the data clock may be used for a data write timing provided to the memory device and a data read timing provided from the memory device. A frequency of the data clock may be higher than a frequency of the system clock. For example, the frequency of the data clock may be an integer multiple of the frequency of the system clock.

The system clock provided to the memory device may be used to generate an internal clock signal that controls a timing of various internal circuits during a memory operation. Timing of an internal circuit may be important during the memory operation, and a timing deviation of a clock may cause malfunction. An example deviation in a clock timing may be duty cycle distortion, i.e., deviation from a 50% duty cycle.

The memory controller may employ training to adjust a duty cycle of a clock transmitted to the memory device to an ideal value of 50%. The memory device may generate a multi-phase clock from the received clock for a high-speed operation. Multi-phase clock signals may have a phase relationship of 90 degrees (0 degrees, 90 degrees, 180 degrees, 270 degrees, etc.) with respect to each other. The memory device may perform clock training to adjust the duty cycle of the multi-phase clock. Clock training of a single clock sweep method (in which each multi-phase clock is individually phase-swept) may be performed. In the single clock sweep method, sweeping one clock window may affect duty characteristics of the other clock signals, and because an unaffected window may occur in the entire multi-phase clock window, it may be difficult to find an optimal clock duty cycle. In addition, in the single clock sweep method, a significant amount of time may be involved for clock training as the phase sweep is sequentially and repeatedly performed.

As described above, embodiments relate to applications and methods, and more particularly, to an apparatus, a memory device, and an operating method thereof to simultaneously perform duty cycle training on a multi-phase clock to find a three-dimensional (3-D) duty offset code and reduce a clock training time.

Embodiments may provide an apparatus, a memory device, and an operating method thereof for searching for a three-dimensional (3-D) duty offset code and reducing a clock training time by simultaneously performing duty cycle training on a multi-phase clock three-dimensionally.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A memory device, comprising:
a plurality of signal pins; and
a clock training circuit configured to receive a clock through a first signal pin, among the plurality of signal pins, and connected to a first signal line connected to the first signal pin, wherein the clock training circuit is further configured to generate a multi-phase clock upon receiving the clock, and generate a three-dimensional duty offset code (3-D DOC) for the multi-phase clock by simultaneously phase-sweeping between three internal clock signals in a duty adjustment step in the multi-phase clock, wherein the clock training circuit is further configured to perform a first step operation of sweeping phases between the three internal clock signals in a first adjustment range, select a first phase offset point, among phase offset points associated with the first step operation, and output an internal clock signal including the first phase offset point, as a first internal clock signal, and wherein the first adjustment range includes an adjustment at range of −n to +n steps, wherein n is a non-zero whole number.

2. The memory device as claimed in claim 1, wherein the clock training circuit is configured to perform a first duty adjustment point evaluation of merging a pulse width window of each of the internal clock signals appearing at the phase offset points associated with the first step operation, and select a phase offset point having a largest value, among merged pulse width windows by the first duty adjustment point evaluation, as the first phase offset point.

3. The memory device as claimed in claim 1, wherein:
the clock training circuit is configured to perform a second step operation of sweeping the phases between the three internal clock signals in a second adjustment range, based on the first phase offset point as the origin, select a second phase offset point, among phase offset points associated with the second step operation, and output the first internal clock signal including the second phase offset point, as a second internal clock signal, and
the second adjustment range includes an adjustment range of −n/2 to +n/2 steps, wherein n/2 is a non-zero whole number.

4. The memory device as claimed in claim 3, wherein the clock training circuit is configured to perform a duty adjustment point evaluation of merging a pulse width of each of the three internal clock signals appearing at the phase offset points associated with the second step operation, and select a phase offset point having a largest value, among merged pulse width windows by the duty adjustment point evaluation, as the second phase offset point.

5. The memory device as claimed in claim 4, wherein the clock training circuit is configured to omit the duty adjustment point evaluation for a phase offset point deviating from the −n/2 to +n/2 steps, among the phase offset points associated with the second step operation.

6. The memory device as claimed in claim 3, wherein:
the clock training circuit is configured to perform a third step operation of sweeping the phases between the three internal clock signals in a third adjustment range based on the second phase offset point as the origin, select a third phase offset point, among phase offset points associated with the third step operation, and output the second internal clock signal including the third phase offset point, as a third internal clock signal, and
the third adjustment range includes an adjustment range of −n/4 to +n/4 steps, wherein n/4 is a non-zero whole number.

7. The memory device as claimed in claim 6, wherein the clock training circuit is configured to perform a third duty adjustment point evaluation of merging a pulse width of each of the second internal clock signals appearing at the phase offset points associated with the third step operation, and select a phase offset point having a largest value, among merged pulse width windows by the third duty adjustment point evaluation, as the third phase offset point.

8. The memory device as claimed in claim 7, wherein the clock training circuit is configured to omit the third duty adjustment point evaluation for a phase offset point deviating from the −n/4 to +n/4 steps, among the phase offset points associated with the third step operation.

9. The memory device as claimed in claim 6, wherein the clock training circuit is configured to output the third phase offset point as the 3-D DOC.

10. A memory controller, comprising:
a plurality of signal pins; and
a training circuit configured to transmit a clock through a first signal pin, among the plurality of signal pins, receive a three-dimensional duty offset code (3-D DOC) related to the clock through a second signal pin, and connected to a first signal line connected to the first signal pin and a second signal line connected to the second signal pin, wherein:
the training circuit adjusts a timing of the clock based on the 3-D DOC and outputs the adjusted timing to the first signal pin, and
the 3-D DOC is obtained by simultaneously phase-sweeping three internal clock signals in a multi-phase clock derived from the clock in a duty adjustment step by a clock training operation performed in a memory device connected to the first and second signal pins, and is configured to correct a duty error of the multi-phase clock.

11. The memory controller as claimed in claim 10, wherein:
the clock training operation includes performing a first step operation of sweeping phases between the internal clock signals in a first adjustment range, selecting a first phase offset point, among phase offset points associated with the first step operation, and outputting she an internal clock signal including the first phase offset point, as a first internal clock signal, and
the first adjustment range includes an adjustment range of −n to +n steps, wherein n is a non-zero whole number.

12. The memory controller as claimed in claim 11, wherein the clock training operation includes performing a first duty adjustment point evaluation of merging a pulse width of each of the internal clock signals appearing at the phase offset points associated with the first step operation, and selecting a phase offset point having a largest value, among merged pulse width windows by the first duty adjustment point evaluation, as the first phase offset point.

13. The memory controller as claimed in claim 11, wherein:
the clock training operation includes performing a second step operation of sweeping the phases between the internal clock signals in a second adjustment range, based on the first phase offset point as the origin, selecting a second phase offset point, among phase offset points associated with the second step operation, and outputting the first internal clock signal including the second phase offset point, as a second internal clock signal, and
the second adjustment range includes an adjustment range of −n/2 to +n/2 steps, wherein n/2 is a non-zero whole number.

14. The memory controller as claimed in claim 13, wherein the clock training operation includes performing a duty adjustment point evaluation of merging a pulse width of each of the internal clock signals appearing at the phase offset points associated with the second step operation, and selecting a phase offset point having a largest value, among merged pulse width windows by the duty adjustment point evaluation, as the second phase offset point.

15. The memory controller as claimed in claim 14, wherein the clock training operation includes omitting the duty adjustment point evaluation for a phase offset point deviating from the −n/2 to +n/2 steps, among the phase offset points associated with the second step operation.

16. The memory controller as claimed in claim 13, wherein:
the clock training operation includes performing a third step operation of sweeping the phases between the internal clock signals in a third adjustment range, based on the second phase offset point as the origin, selecting a third phase offset point, among phase offset points associated with the third step operation, and outputting the second internal clock signal including the third phase offset point, as a third internal clock signal, and the third adjustment range includes an adjustment range of −n/4 to +n/4 steps, wherein n/4 is a non-zero whole number.

17. The memory controller as claimed in claim 16, wherein the clock training operation includes performing a third duty adjustment point evaluation of merging a pulse width of each of the second internal clock signals appearing at the phase offset points associated with the third step operation, and selecting a phase offset point having a largest value, among merged pulse width windows by the third duty adjustment point evaluation, as the third phase offset point.

18. The memory controller as claimed in claim 17, wherein the clock training operation includes omitting the third duty adjustment point evaluation for a phase offset point deviating from the −n/4 to +n/4 steps, among the phase offset points associated with the third step operation.

19. The memory controller as claimed in claim 16, wherein the clock training operation includes outputting the third phase offset point as the 3-D DOC.

\* \* \* \* \*